United States Patent
Edley et al.

(10) Patent No.: US 11,289,325 B2
(45) Date of Patent: Mar. 29, 2022

(54) RADIATION OF SUBSTRATES DURING PROCESSING AND SYSTEMS THEREOF

(71) Applicant: Tokyo Electron Limited, Tokyo (JP)

(72) Inventors: Michael Edley, Philadelphia, PA (US); Xinghua Sun, Clifton Park, NY (US); Yen-Tien Lu, Hillsboro, OR (US); Angelique Raley, Albany, NY (US); Henan Zhang, Clifton Park, NY (US); Hiroyuki Suzuki, Kumato (JP); Shan Hu, Mechanicville, NY (US)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 17/180,077

(22) Filed: Feb. 19, 2021

(65) Prior Publication Data

US 2021/0407790 A1 Dec. 30, 2021

Related U.S. Application Data

(60) Provisional application No. 63/044,495, filed on Jun. 26, 2020, provisional application No. 63/043,921, filed on Jun. 25, 2020.

(51) Int. Cl.
*H01L 21/02* (2006.01)
*H01L 21/311* (2006.01)
*H01L 21/67* (2006.01)

(52) U.S. Cl.
CPC .. *H01L 21/02063* (2013.01); *H01L 21/31116* (2013.01); *H01L 21/31138* (2013.01); *H01L 21/67069* (2013.01); *H01L 21/67115* (2013.01); *H01L 21/67155* (2013.01)

(58) Field of Classification Search
None
See application file for complete search history.

(56) References Cited

U.S. PATENT DOCUMENTS

| 6,468,599 B1 | 10/2002 | Terada |
| 7,208,389 B1 | 4/2007 | Tipton et al. |
| 10,304,725 B2 | 5/2019 | Sun et al. |
| 2015/0128991 A1 | 5/2015 | Brown et al. |
| 2017/0011887 A1 | 1/2017 | Deshmukh et al. |

(Continued)

FOREIGN PATENT DOCUMENTS

| CN | 104347337 A | 2/2015 |
| KR | 20160086375 A | 7/2016 |

OTHER PUBLICATIONS

Jinnai, Butsurin, et al., "Role of UV Irradiation during Si Etching Process in Chlorine Plasma," Fifth International Symposium on Control of Semiconductor Interfaces, Ushio, Oct. 2008, 4 pages.

(Continued)

*Primary Examiner* — Roberts P Culbert
(74) *Attorney, Agent, or Firm* — Slater Matsil, LLP

(57) ABSTRACT

A method for processing a substrate includes performing a first etch process to form a plurality of partial features in a dielectric layer disposed over the substrate; performing an irradiation process to irradiate the substrate with ultra-violet radiation having a wavelength between 100 nm and 200 nm; and after the irradiation process, performing a second etch process to form a plurality of features from the plurality of partial features.

16 Claims, 20 Drawing Sheets

(56) References Cited

U.S. PATENT DOCUMENTS

2017/0278695 A1 9/2017 Brown
2018/0158725 A1* 6/2018 Lee .................. H01L 21/76825

OTHER PUBLICATIONS

Mizubayashi, Wataru, et al., "Impacts of plasma-induced damage due to UV light irradiation during etching on Ge fin fabrication and device performance of Ge fin field-effect transistors," Applied Physics Express 10, 026501, Jan. 11, 2017, 5 pages.
PCT International Search Report and Written Opinion in counterpart PCT application PCT/US2021/032551, dated Aug. 31, 2021, 8 pages.

* cited by examiner

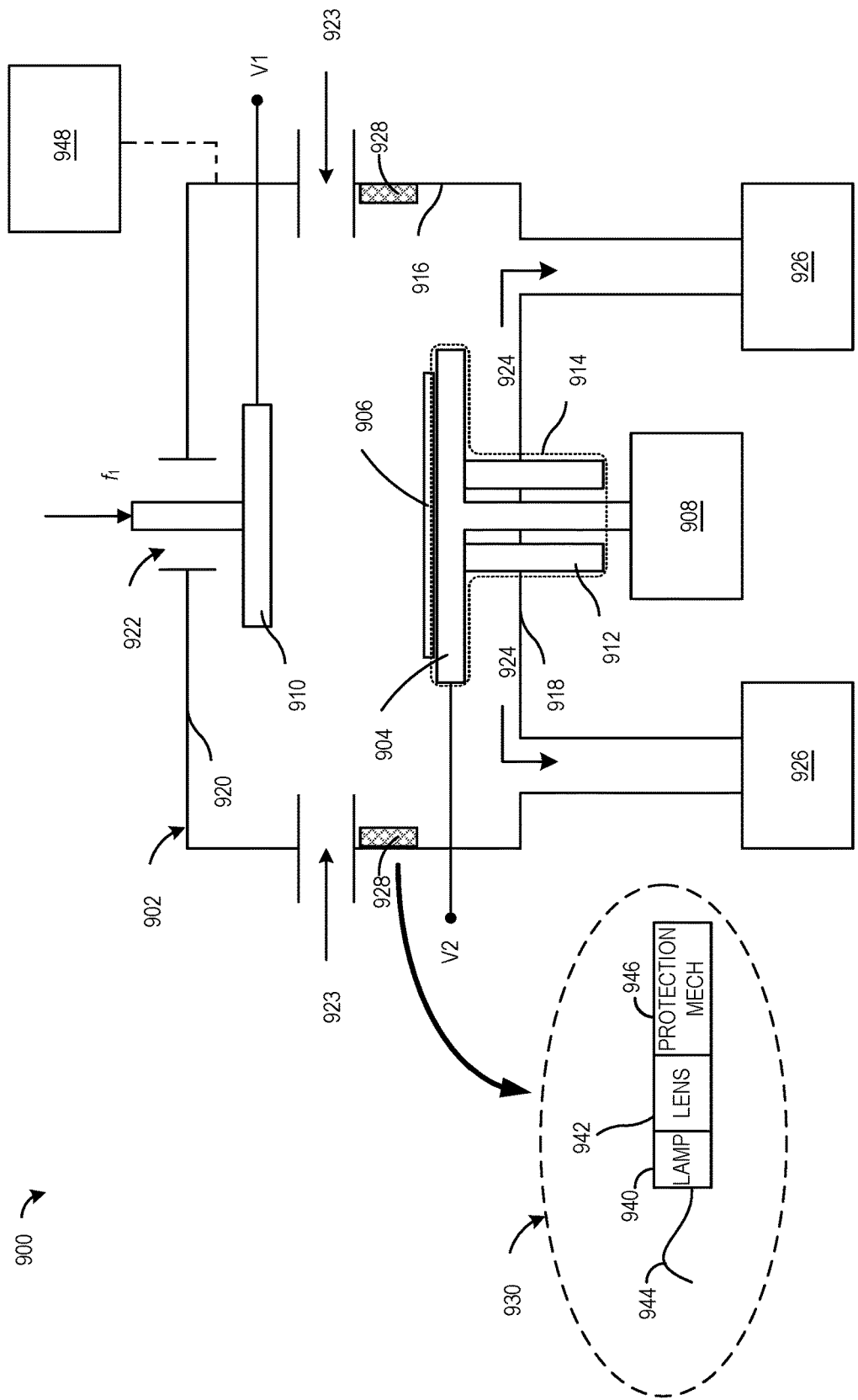

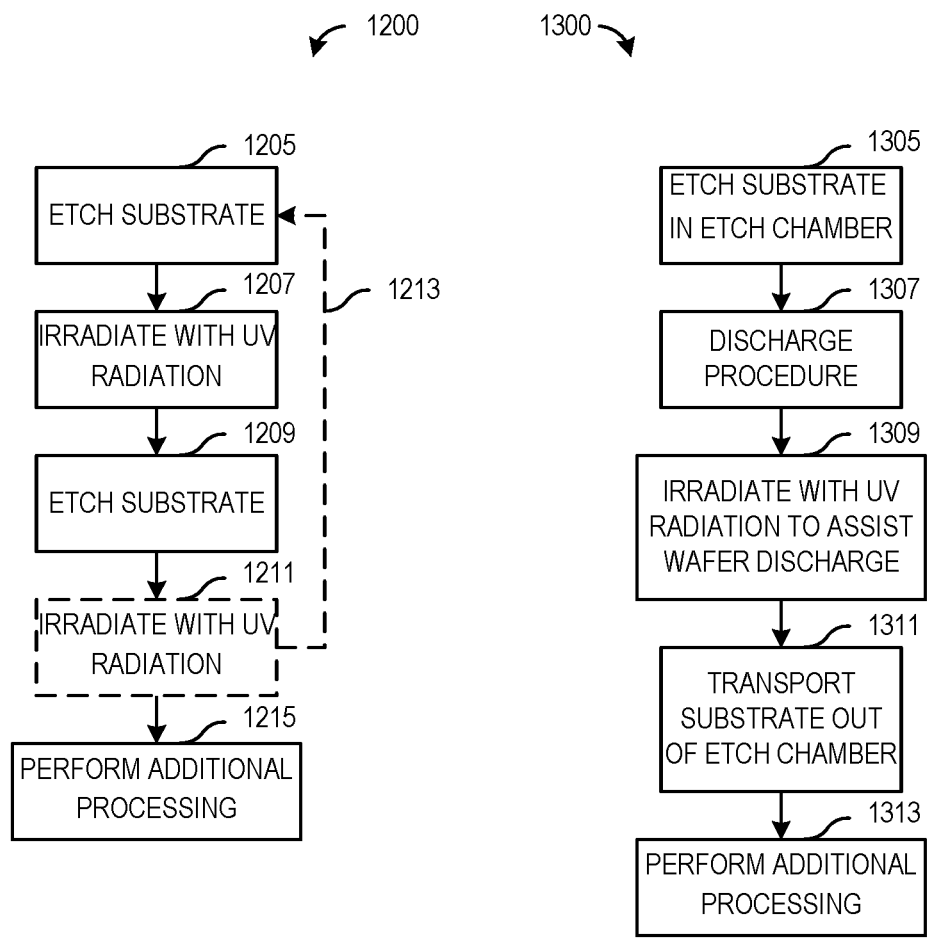

RADIATION OF SUBSTRATES DURING PROCESSING AND SYSTEMS THEREOF

CROSS-REFERENCE TO RELATED APPLICATIONS

This application claims the benefit of U.S. Provisional Application No. 63/044,495, filed on Jun. 26, 2020 and U.S. Provisional Application No. 63/043,921, filed on Jun. 25, 2020, which applications are hereby incorporated herein by reference.

TECHNICAL FIELD

The present invention relates generally to substrate processing, and, in particular embodiments, to radiation of substrates being processed during device fabrication.

BACKGROUND

Device formation within microelectronic workpieces may involve a series of manufacturing techniques including formation, patterning, and removal of a number of layers of material on a substrate. In order to achieve the physical and electrical specifications of current and next generation semiconductor devices, processing apparatus and methods that enable reduction of feature size while maintaining structural integrity are desirable for various patterning processes. Historically, with microfabrication, transistors have been created in one plane, with wiring/metallization formed above, and have thus been characterized as two-dimensional (2D) circuits or 2D fabrication. Scaling efforts have greatly increased the number of transistors per unit area in 2D circuits, yet scaling efforts are running into greater challenges as scaling enters nanometer-scale semiconductor device fabrication nodes. Therefore, there is a desire for three-dimensional (3D) semiconductor devices in which transistors are stacked on top of each other.

As device structures densify and develop vertically, the desire for precision material processing becomes more compelling. Trade-offs between selectivity, profile control, film conformality, and uniformity in plasma processes can be difficult to manage. Thus, equipment and techniques that isolate, and control the process conditions that are optimal for etch and deposition regimes are desirable in order to precisely manipulate materials and meet advanced scaling challenges.

Plasma processing of certain materials, such as organics and dielectrics, can lead to the build-up of by-product residues. The build-up of the by-product residues can negatively impact etching performance, leading to tapered vias or contact opening profiles. Therefore, there is a need for apparatus and methods that assist in the removal of such build-up.

SUMMARY

In accordance with an embodiment of the invention, a method is provided for processing a substrate. The method comprising: performing a first etch process to form a plurality of partial features in a dielectric layer disposed over the substrate; performing an irradiation process to irradiate the substrate with ultra-violet radiation having a wavelength between 100 nm and 200 nm; and after the irradiation process, performing a second etch process to form a plurality of features from the plurality of partial features.

In accordance with another embodiment, a method is provided for processing a substrate. The method comprising: executing a cyclic process comprising a plurality of sequences, each sequence of the plurality of sequences comprising exposing the substrate to ultra-violet radiation after exposing the substrate to a plasma process.

In accordance with still another embodiment of the invention, a system is provided. The system comprising: a plurality of processing chambers configured to process a substrate within the processing chambers; a wafer holding location comprising a first ultra-violet radiation source configured to emit ultra-violet radiation onto a wafer located at the wafer holding location; and a transporting apparatus configured to move the substrate between the plurality of processing chambers and the wafer holding location.

BRIEF DESCRIPTION OF THE DRAWINGS

For a more complete understanding of the present invention, and the advantages thereof, reference is now made to the following descriptions taken in conjunction with the accompanying drawings, in which:

FIG. 7D illustrates a view of the top of ultra-violet treatment zone highlighting a first example arrangement of ultra-violet radiation sources in accordance with example embodiments presented herein;

FIG. 7E illustrates a view of the top of ultra-violet treatment zone highlighting a second example arrangement of ultra-violet radiation sources in accordance with example embodiments presented herein;

FIG. 9A illustrates a cross sectional view of a first example plasma processing apparatus with ultra-violet radiation sources disposed on sidewalls of a plasma etch chamber in accordance with example embodiments presented herein;

FIG. 12 illustrates a flow diagram of an example substrate process with ultra-violet radiation to assist in by-product residue removal in accordance with example embodiments presented herein; and FIG. 13 illustrates a flow diagram of an example substrate process with ultra-violet radiation to assist in substrate discharge in accordance with example embodiments presented herein.

Corresponding numerals and symbols in the different figures generally refer to corresponding parts unless otherwise indicated. The figures are drawn to clearly illustrate the relevant aspects of the embodiments and are not necessarily drawn to scale. The edges of features drawn in the figures do not necessarily indicate the termination of the extent of the feature.

DETAILED DESCRIPTION OF ILLUSTRATIVE EMBODIMENTS

The making and using of various embodiments are discussed in detail below. It should be appreciated, however, that the various embodiments described herein are applicable in a wide variety of specific contexts. The specific embodiments discussed are merely illustrative of specific ways to make and use various embodiments, and should not be construed in a limited scope.

Various techniques, as described herein, pertain to device fabrication using precision plasma processing techniques, including etch and deposition processes. Several instances manifest in semiconductor manufacturing in both front end of line (FEOL, e.g., transistor fabrication) processing through to the back end of line (BEOL, e.g., interconnect fabrication) processing, where materials are to be manipulated with a high degree of precision.

Figure 1:
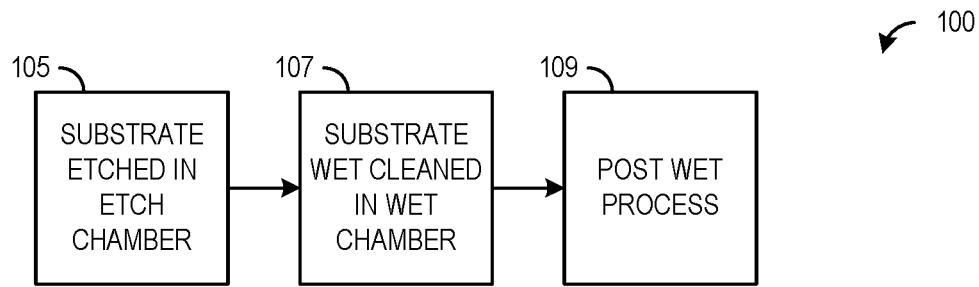
FIG. 1 illustrates a conventional substrate dry etch/plasma processing flow.

FIG. 1 illustrates a prior art substrate dry etch/plasma processing flow 100. Substrate processing flow 100 illustrates processing performed on a substrate. Substrate processing flow 100 includes etching the substrate in an etch chamber (block 105). Etching of the substrate may be performed in a plasma etch chamber, for example. Reactive ion etching (RIE), for example, using an inductively coupled plasma (ICP) or a capacitively coupled plasma (CCP), are two examples of plasma etching processes. After substrate etching, the substrate may be wet cleaned (block 107). The wet cleaning may be performed in a wet chamber using solvents and/or detergents. Different cleaning solvents and/or detergents may be used, depending upon the material being removed. Additional processing of the substrate may be performed after the wet cleaning process (block 109). Examples of the additional processing may include addition etch or metallization steps.

Although the RIE plasma processing may offer fine critical dimension (CD) control and reduced damage to targeted materials, such as various low-k materials, there is a side-effect of RIE plasma processing that can negatively impact etch performance. By-product residues, which are a side-effect of RIE plasmas processing with highly polymerizing chemistries (also commonly referred to as high depositing chemistries), may form deposits on the substrate and hinder etch performance or stop it all together. The by-product residues are the result of etch operations in RIE plasma processing of substrates. The RIE plasma processing of substrates with high depositing chemistries offer advantages, including but not limited to fine control of CD and reduced damage to dielectric materials, such as, low-k carbon doped oxide (SiCOH), $Si_3N_4$, and so on. The by-product residue deposits can cause tapered via or contact hole profiles, or completely clog the via or contact hole. Using RIE plasma processing with leaner chemistries can help to reduce the by-product residue deposits, but may increase damage to low-k material or CD blow out during subsequent processing steps.

As discussed above, the by-product residue formed in certain RIE chemistries and the by-product residue deposits thereof may cause tapered via or contact opening profiles or clog the opening entirely. The tapered opening profiles or clogged openings may lead to partially formed vias or contacts with increased electrical resistance due to reduced conductor sizes, vias or contacts without any electrical connectivity due to clogged openings, and so on. Therefore, there is a need for apparatus and methods for alleviating issues arising from by-product residue of etch processes.

According to an example embodiment, a substrate is irradiated with ultra-violet radiation. Irradiating the substrate with ultra-violet radiation also irradiates the by-product residue deposits. The ultra-violet radiation, incident on the by-product residue deposits on top of openings, along opening walls, at the bottom of openings, or a combination thereof, weakens the chemical bonds present in the by-product residue in the by-product residue deposits. The weakened by-product residue may then be removed in processing of the substrate. The weakened by-product residue may be easier to remove, enabling for more (or all) of the weakened by-produce residue to be removed.

In an embodiment, ultra-violet radiation with wavelength in the range of 100 nm and 400 nm is used to irradiate the substrate. In an embodiment, ultra-violet radiation with wavelength in the range of 100 nm and 200 nm is used to irradiate the substrate, depending upon what kinds of polymer being controlled. Ultra-violet radiation with wavelength in the range of 100 nm and 200 nm is considered to be in the lower subband of the ultra-violet radiation range. In an embodiment, ultra-violet radiation with wavelength in the range of 150 nm and 200 nm is used to irradiate the substrate, depending upon what kinds of polymer being controlled. Ultra-violet radiation with wavelength in the range of 100 nm and 200 nm has been shown to be effective at weakening the chemical bond of by-product residue of RIE etching of organic materials (such as OPL, SOH, SOC, etc.) and dielectrics (such as SiCOH, dense SiCOH, porous SiCOH, and so on). As an example, in a situation when the by-product residues comprise C=C/C=N double bonds and C—F single bonds (such as the by-produce residues form by the plasma processing of organic materials and dielectrics), the ultra-violet radiation with particular wavelength may break such bonds to form weak C—O or C—H bonds that may be much easier to etch off. The actual mechanism may vary depending on the type of by-products. For example, in some cases, the ultra-violet radiation may lower the activation barrier, i.e., increase the kinetics of the reaction like a catalyst especially when performed concurrently with an etching process while in another case the ultra-violet radiation may cause the formation of intermediary complexes that are unstable, which are then more easily removed in a subsequent process. Although the discussion focuses the use of ultra-violet radiation to weaken the chemical bond of by-product residue arising from RIE etching of organic materials and dielectrics. However, ultra-violet radiation may also be used in other applications, such as the etching of silicon, where the ultra-violet radiation may be used in a plasma etch-like manner. Similarly, electromagnetic radiation such as ultra-violet radiation as described in various embodiments may be applied in applications as a catalyst (e.g., to increase the reaction rates), or to provide activation energy so as to effectively increase the reaction rate of an accompanying etching process.

In an embodiment, the substrate is irradiated with an ultra-violet radiation dose ranging between 20 and 2000 mJoules. The ultra-violet radiation dosage may vary, depending on application. As an example, when an etch that forms large amounts of by-product residue is being performed, a large dose of ultra-violet radiation is needed, while a small dose of ultra-violet radiation is needed when an etch that forms small amounts of by-product residue. As another example, the ultra-violet radiation dose is dependent on the characteristics of the by-product residue formed. The ultra-violet radiation dosage is closely related to ultra-violet radiation exposure duration. As an example, for an ultra-violet radiation source with a particular intensity, the duration of the exposure is related to the dosage, with higher durations corresponding to higher dosages. Therefore, it is possible to characterize the ultra-violet radiation in terms of dosage or duration.

Although the discussion focuses on irradiating substrate with ultra-violet radiation, including ultra-violet radiation in the range of 100 nm and 200 nm or 150 nm and 200 nm, the example embodiments presented herein are operable with other types of electromagnetic radiation (EMR), including but not limited to EMR in the low ultra-violet range (e.g., between 10 nm and 100 nm), the x-ray range (e.g., 0.01 nm to 10 nm), the visible light range (e.g., the range of 400 nm and 750 nm), infrared range (e.g., the range of 750 nm and 1 mm), and microwave range (e.g., the range of 1 mm and 1 m). In certain embodiments, radiation source may be a laser device that emits electromagnetic radiation through a process of optical amplification based on the stimulated emission of electromagnetic radiation. In embodiments, the laser may be a solid state laser such as a Nd:YAG laser, a gas laser such as excimer laser, or a metal vapor laser. Therefore, the discussion of ultra-violet radiation should not be construed as being limiting to the scope of the example embodiments.

In an embodiment, the substrate is irradiated with ultra-violet radiation during an etch process. In other words, the start of the ultra-violet radiation exposure begins after the start of the etch process and the end of the ultra-violet radiation exposure ends before the end of the etch process. The ultra-violet radiation weakens the chemical bonds present in the by-product residue. In an embodiment, the etch process removes the by-product residue. In another embodiment, a subsequent process removes the by-product residue. The subsequent process may be another etch process, a continuation of the same etch process taking place while the substrate is being irradiated, or a process that is not an etch process, such as a cleaning process, a depositing processing, or a post etch treatment (PET).

In an embodiment, the substrate is irradiated with ultra-violet radiation after an etch process. After an etch process completes or a partial completion of an etch process, the substrate is irradiated with ultra-violet radiation. After being irradiated with ultra-violet radiation, the substrate undergoes a subsequent process, which may be another etch process, the partially completed etch process, or a process that is not an etch process, such as a cleaning process or a PET. The subsequent process removes the by-product residue.

In an embodiment, the start of the irradiation of the substrate with ultra-violet radiation begins during the etch process, but the exposure to the ultra-violet radiation extends to past the end of the etch process. After completion of the ultra-violet radiation treatment, the substrate undergoes a subsequent process, which may be another etch process, the partially completed etch process, or a process that is not an etch process, such as a cleaning process or a PET. The subsequent process removes the by-product residue. In an embodiment, the start of the irradiation of the substrate with ultra-violet radiation begins before the start of the etch process, but the exposure to the ultra-violet radiation extends to past the end of the etch process. In an embodiment, the start of the irradiation of the substrate with ultra-violet radiation begins before the start of the etch process, and the exposure to the ultra-violet radiation ends prior to the end of the etch process.

In an embodiment, in a substrate process where there is cyclic processing of the substrate, the substrate is irradiated with ultra-violet radiation during or after a subset of the processing cycles, where a processing cycle includes an etch process. In other words, the substrate is irradiated with ultra-violet radiation during or after one or more processing cycles. For each processing cycle, the substrate may be irradiated with the ultra-violet radiation after the etch process. In an embodiment, the same ultra-violet radiation (i.e., same wavelength and same dose or duration) is used to irradiate the substrate for each processing cycle. In an embodiment, different ultra-violet radiation (i.e., different wavelength and/or different dose or duration) is used to irradiate the substrate for each processing cycle.

Figure 2:
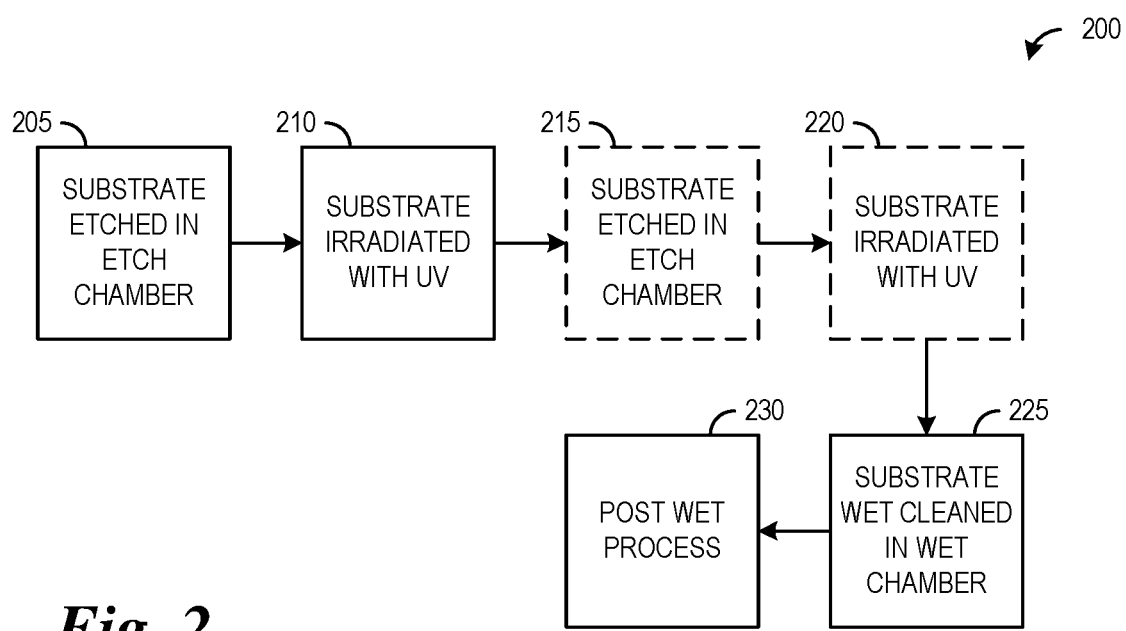
FIG. 2 illustrates an example substrate process flow in accordance with example embodiments presented herein.

FIG. 2 illustrates an example substrate process flow 200 in accordance with example embodiments presented herein. Substrate process flow 200 illustrates an example process flow for processing a substrate with ultra-violet assisted by-product residue removal. Substrate process flow 200 may be applicable for ex-situ substrate processing or in-situ substrate processing. Substrate process flow 200 is presented herein for BEOL processing wherein transistors and other active devices have already been fabricated. However, substrate process flow 200 may also be operable for FEOL processing where transistors and other active devices are being fabricated. Therefore, the focus on BEOL processing should not be construed as being limiting to the inventor or example embodiments.

Substrate process flow 200 includes etching the substrate in an etch chamber (block 205). The substrate may be etched using a RIE, for example. The RIE uses highly polymerizing etching chemistries include chemistries that are depositing in nature, including $CH_2F_2$, $C_4F_8$, $C_4F_6$, $CH_3F$, $NF_3$, $CH_4$ and so on. Hence, by-product residue is formed and by-product residue deposits may form at locations throughout the substrate, including but not limited to the top of openings, the bottom of openings, along the walls of openings, or a combination thereof. The by-product residue deposits may hinder the etch process or subsequent etch processes. In an embodiment, the irradiating of the substrate occurs before the substrate has been etched (e.g., block 210 occurs before block 205). In an embodiment, the irradiating of the substrate occurs in the etch chamber where the etching of the substrate occurs.

Substrate process flow 200 also includes irradiating the substrate with ultra-violet radiation (block 210). Irradiating the substrate comprises irradiating the substrate with ultra-violet radiation at a particular wavelength or in a range of wavelengths. The substrate is irradiated with the ultra-violet radiation for a specified dose or duration. In an embodiment, the irradiating of the substrate of the substrate occurs after the substrate has been etched (e.g., block 210 occurs after block 205).

Substrate process flow 200 optionally includes an additional etching of the substrate (block 215). In an embodiment, the optional etching of the substrate comprises an etch process that is different from the etch process of block 205. In an embodiment, the optional etching of the substrate comprises the same etch process as the etch process of block 205.

Substrate process flow 200 optionally includes an additional irradiating of the substrate with ultra-violet radiation (block 220). In an embodiment, the ultra-violet radiation used in block 220 is the same ultra-violet radiation (i.e., the same wavelength for the same dose or duration) used in block 210. In an embodiment, the ultra-violet radiation used in block 220 is different from the ultra-violet radiation used in block 210 (i.e., different wavelength, different dose or duration, or both different wavelength and different dose or duration).

In an embodiment, even if the additional etching of the substrate (block 215) occurs, the additional irradiating of the substrate with ultra-violet radiation (block 220) remains optional. In other words, blocks 215 and 220 are independent and one can occur without the other occurring.

In an embodiment, the additional etching of the substrate (block 215) and the additional irradiating of the substrate with ultra-violet radiation (block 220) may occur any number of times, including none at all. In other words, blocks 215 and 220 may occur 0, 1, 2, 3, and so on, number of times. Furthermore, other substrate processing may occur in between, before, or after, blocks 215 and 220.

Substrate process flow 200 includes wet cleaning the substrate in a wet chamber (block 225). Any wet cleaning process compatible with the substrate may be used. Substrate process flow 200 further includes post wet process processing (block 230). Post wet processing may include metal hard mask stripping, metal filling, etc.

Figure 3A:
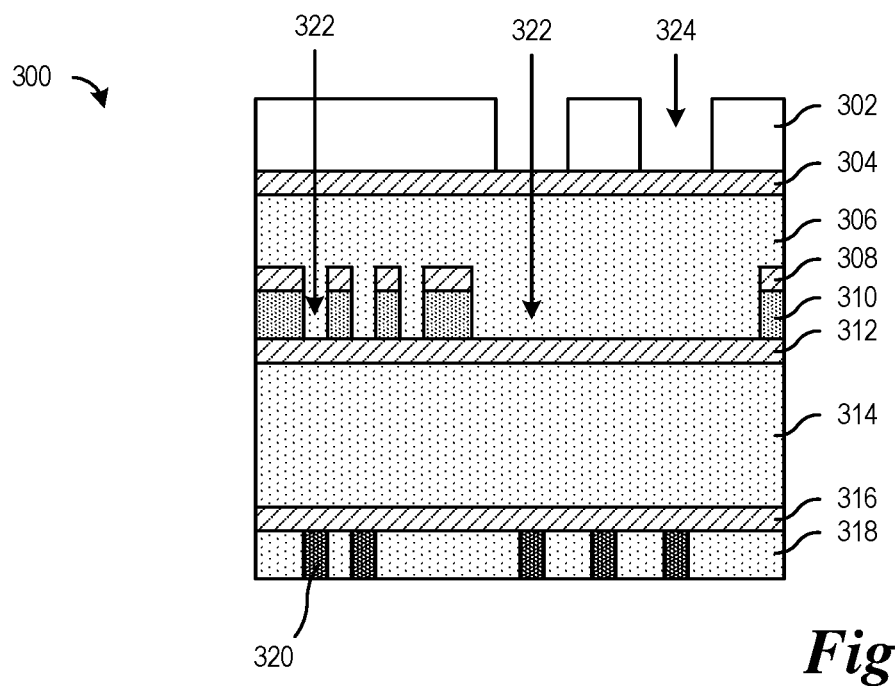
FIGS. 3A-3G illustrate a substrate undergoing a substrate processing flow, highlighting a problem with by-product residues of etch operations as identified by the inventors of this application.

FIGS. 3A-3G illustrate a substrate undergoing a substrate processing flow, highlighting a problem with by-product residues of etch operations as identified by the inventors of this application. The substrate processing flow may be a BEOL dual Damascene process flow, for example. Referring now to FIG. 3A, a wafer 300 includes a substrate 318 that includes contacts, such as contact 320. A protective layer 316, such as an etch stop layer (ESL), is formed over substrate 318 and the contacts. A dielectric layer 314 is formed over protective layer 316. Dielectric layer 314 may be formed from a material having low-dielectric (low-k) or ultra-low-k (ULK) properties. A first hard mask (HM) or metal HM (MHM) (HM/MHM) layer 312 is formed over dielectric layer 314.

A contact layer 310 is formed over first HM/MHM layer 312. A second HM/MHM layer 308 is formed over contact layer 310. Contact layer 310 and second HM/MHM layer 308 are patterned for openings, such as opening 322. The openings may be used to form vias, contacts, etc. An organic layer 306 is formed over second HM/MHM layer 308, filling contact layer 310 and second HM/MHM layer 308. An anti-reflective coating (ARC) layer 304 is formed over organic layer 306. A photoresist (PR) layer 302 is formed over ARC layer 304. PR layer 302 is patterned for openings, such as opening 324.

Protective layer 316 may be one or more of the following materials, but not limited to: silicon nitride (SiN), silicon oxide (SiOx), silicon carbide (SiC), nitrogen-doped silicon, metal oxides, metal nitrides, metal, nitrogen barrier low-k material (NBLoK), silicon carbide nitride (SiCN), and so on. Dielectric layer 314 may one or more of the following materials, but not limited to: SiCOH, dense SiCOH, porous SiCOH, other porous dielectric materials, and so forth. First HM/MHM layer 312 may be one or more of the following materials, but not limited to: tetraethyl orthosilicate (TEOS), SiOx, low temperature silicon oxide, sacrificial SiN, SiCOH, silicon oxynitride (SiON), silicon-based ARC material, titanium-based ARC material, bottom ARC (BARC) material, etc.

Contact layer 310 may be one or more of the following materials, but not limited to: metal nitrides (including titanium nitride), metal oxides, and so on. Second HM/MHM layer 308 and ARC layer 304 may be one or more of the materials used for first HM/MHM layer 312. Organic layer 306 may be one or more of the following materials, but not limited to: organic planarizing layer (OPL), silicon organic hybrid (SOH), semi-volatile organic compound (SOC), and so forth. PR layer 302 may be one or more of the following materials, but not limited to: positive photoresist material or negative photoresist material. The materials listed herein are intended to be example materials and other materials may also be used.

Figure 3B:
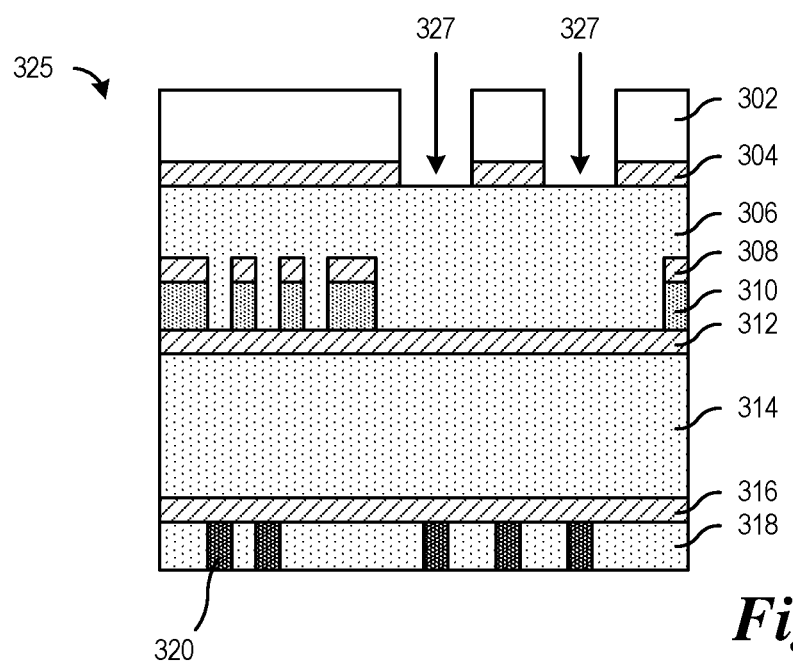

Referring now to FIG. 3B, where wafer 325 illustrates wafer 300 after an etch operation to form openings in ARC layer 304. An example of the etch operation is an ARC open etch. Openings in PR layer 302, such as opening 324, expose portions of ARC layer 304 to the etch operation. Openings in ARC layer 304 include openings 327.

Figure 3C:
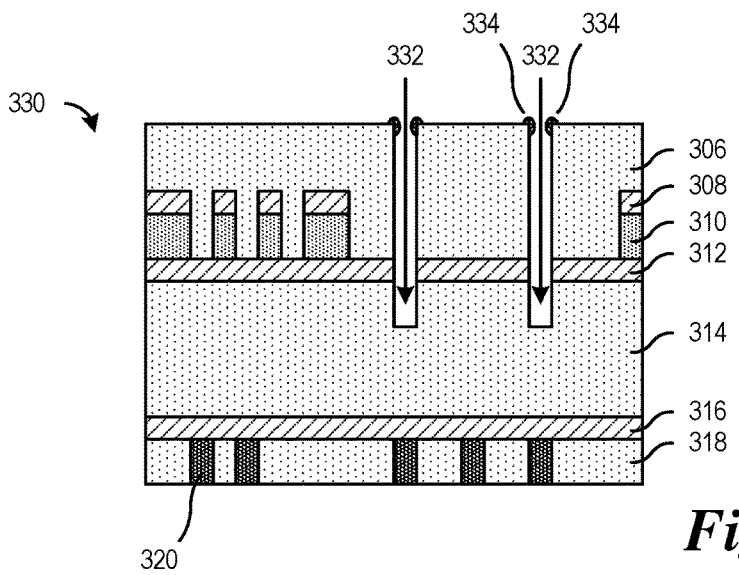

Referring now to FIG. 3C, where wafer 330 illustrates wafer 325 after an etch operation to form openings in organic layer 306, first HM/MHM layer 312, and dielectric layer 314. An example of the etch operation is an organic layer open etch. Openings in ARC layer 304, such as openings 327, expose portions of organic layer 306, first HM/MHM layer 312, and dielectric layer 314, to the etch operation. Openings in organic layer 306, first HM/MHM layer 312, and dielectric layer 314, may be referred to as openings 332. The etch operation also strips PR layer 302 and ARC layer 304 from wafer 325.

Examples of the RIE etch operation includes standard dielectric and organic etch process steps, including plasma containing fluorocarbons, oxygen, nitrogen, hydrogen, argon, and/or other gases. However, the highly depositing etching chemistries that limit damage to dielectric materials, such as, low-k materials, and allow fine control over CD in these etch operations, also typically form by-product residues. Examples of highly depositing etching chemistries include chemistries that are polymerizing in nature, including but not limited to $CH_2F_2$, $C_4F_8$, $C_4F_6$, $CH_3F$, $NF_3$, $CH_4$, and so on. The by-product residues may generally deposit at several locations, including at the top of the openings, at the bottom of the openings, along the walls of the opening, or a combination thereof. Example by-product residue deposits 334 are shown in FIG. 3C as forming at the top of openings 332. The by-product residues may form deposits at other locations on the substrate.

The by-product residue deposits, forming at the top, bottom, along walls, or a combination thereof, of openings can cause undesired tapered opening profiles or even clog the opening completely. As shown in FIG. 3C, by-product residue deposits 334 form at the top of openings 332. The amount of by-product residue deposited at by-product residue deposits 334 may be a function of the etch chemistries, etch durations, and so on. As an example, two etch operations with similar etch chemistries, but with different etch durations, may result in different amounts of by-product residue deposited at by-product residue deposits 334.

Figure 3D:
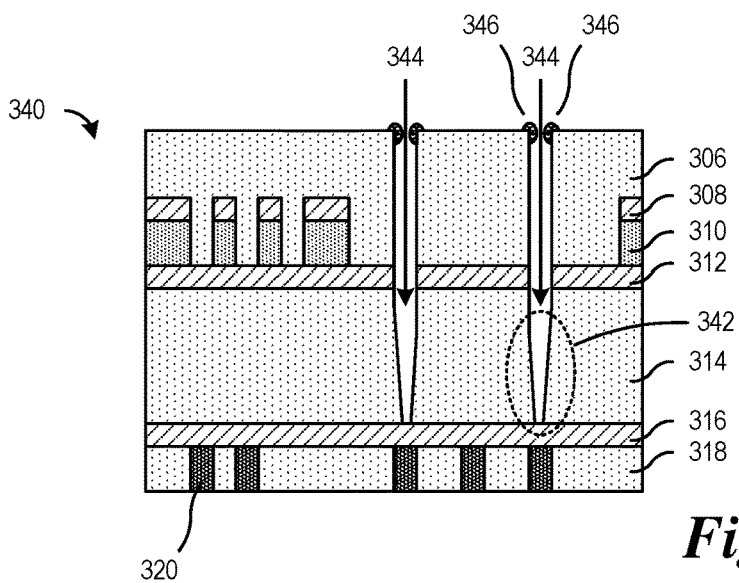

Referring now to FIG. 3D, where wafer 340 illustrates wafer 330 after an etch operation to extend openings in dielectric layer 314. Openings 332 (of FIG. 3C) are extended by another etch operation. However, by-product residue deposits 334 formed at the top of openings 332 restrict the flow of plasma, thereby hindering the plasma flow, and hence, the etch process. The restricted plasma flow causes the extended openings to have a tapered profile (shown as profile 342). Additionally, the additional etch operation causes additional by-product residue deposits to form, enlarging the by-product residue deposits formed at the top of the openings (shown as by-product residue deposits 346 formed at the top of openings 344). Because of the additional etch operation, by-product residue deposits 346 may be larger than by-product residue deposits 334 of FIG. 3C.

Figure 3E:
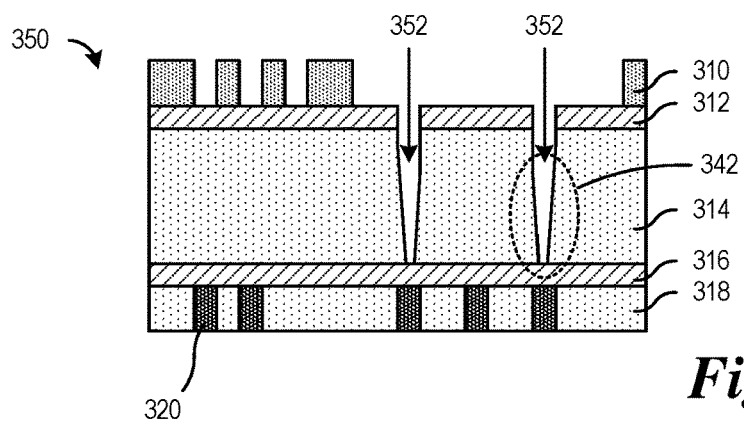

Referring now to FIG. 3E, where wafer 350 illustrates wafer 340 after a HM removal process. The HM removal process may comprise an organic ash and HM removal process. The HM removal process removes second HM/MHM layer 308 and organic layer 306 (both of FIG. 3D), leaving openings 352. Additionally, the HM removal process removes by-product residue deposits 346 (also of FIG. 3D). Although the by-product residue deposits are removed by the HM removal process, the tapered profiles (profile 342) of openings 352 remain.

Figure 3F:
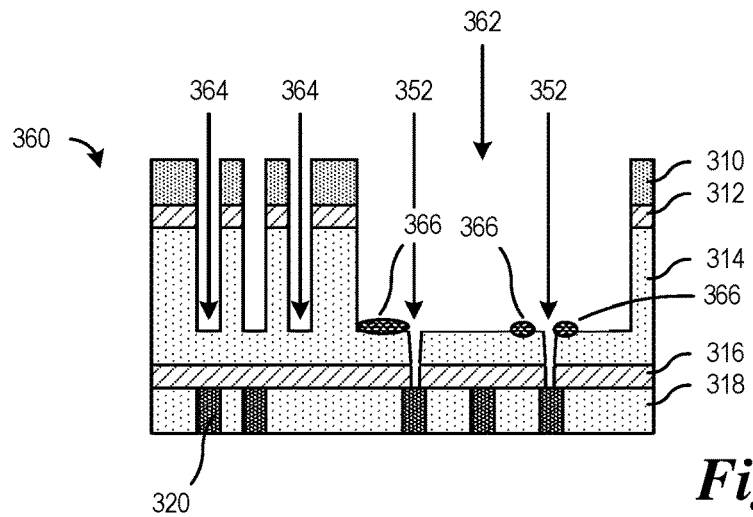

Referring now to FIG. 3F, where wafer 360 illustrates wafer 350 after a trench etch process. The trench etch process removes portions of first HM/MHM layer 312 under openings in contact layer 310. The trench etch may be a fluorine and carbon plasma etch, where the plasma may contain fluorocarbons, oxygen, nitrogen, argon, hydrogen, methane, etc., for example. The trench etch process forms trench 362, as well as openings 364 in dielectric layer 314. The trench etch process forms by-product residues that can deposit at a variety of locations, such as at the tops of openings (shown as by-product residue deposits 366), bottoms of openings, along walls of openings, or a combination thereof.

Figure 3G:
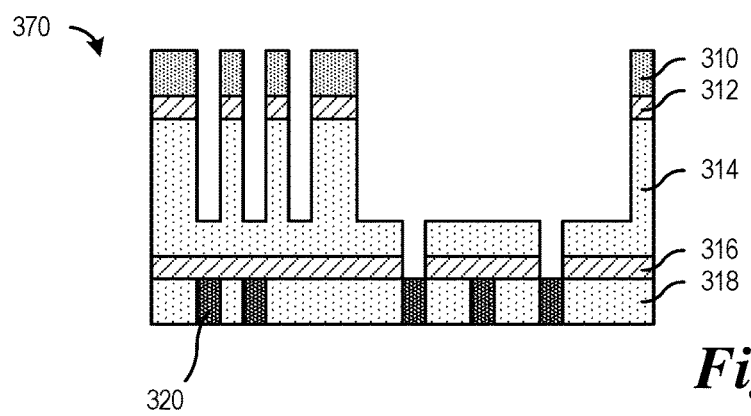

Referring now to FIG. 3G, where wafer 370 illustrates wafer 360 after a post etch treatment (PET). The PET, such as a dry de-fluorine or/and a wet clean, can help to remove the by-product residue deposits, as well as cleaning condensed particles from wafer 360, for example.

FIGS. 4A-4I illustrate example embodiments of a substrate as the substrate undergoes a processing flow with ultra-violet radiation to help control by-product residue deposits formation on tops of openings formed during etch operations in accordance with the example embodiments presented herein. The substrate processing flow may be a BEOL dual Damascene process flow, for example. However, the substrate processing flow may be applicable to other substrate process flows, including subtractive etch process flows.

Figure 4A:
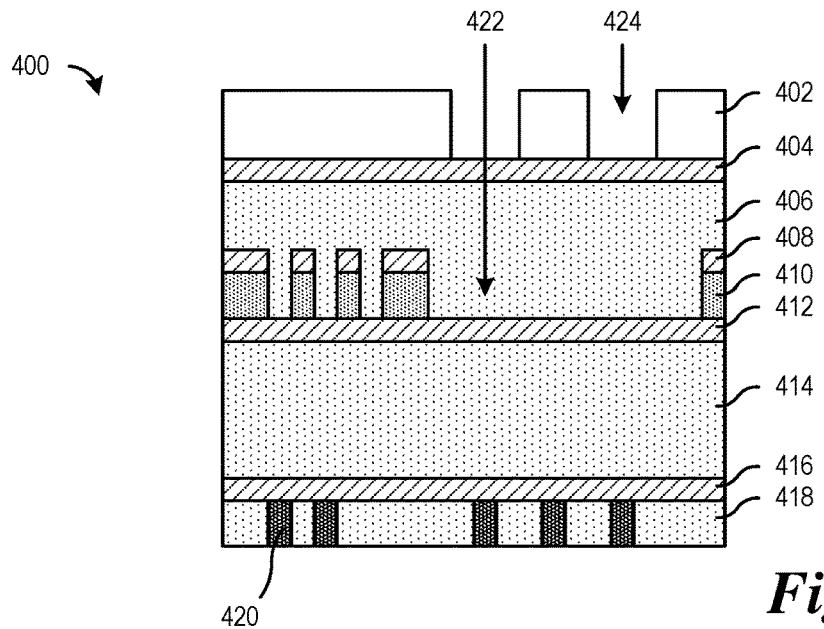
FIGS. 4A-4I illustrate example embodiments of a substrate as the substrate undergoes a processing flow with ultra-violet radiation to help control by-product residue deposits formation on tops of openings formed during etch operations in accordance with the example embodiments presented herein.

Referring now to FIG. 4A, where a wafer 400 includes a substrate 418 that includes contacts, such as contact 420. A protective layer 416, such as an ESL, is formed over substrate 418 and the contacts. A dielectric layer 414 is formed over protective layer 416. Dielectric layer 414 may be formed from a material having low-k or ULK properties. A first HM/MHM layer 412 is formed over dielectric layer 414.

A contact layer 410 is formed over first HM/MHM layer 412. A second HM/MHM layer 408 is formed over contact layer 410. Contact layer 410 and second HM/MHM layer 408 are patterned for openings, such as opening 422. The openings may be used to form vias, contacts, and other features. An organic layer 406 is formed over second HM/MHM layer 408, filling contact layer 410 and second HM/MHM layer 408. An ARC layer 404 is formed over organic layer 406. A PR layer 402 is formed over ARC layer 404. PR layer 402 is patterned for openings, such as opening 424.

Figure 4B:
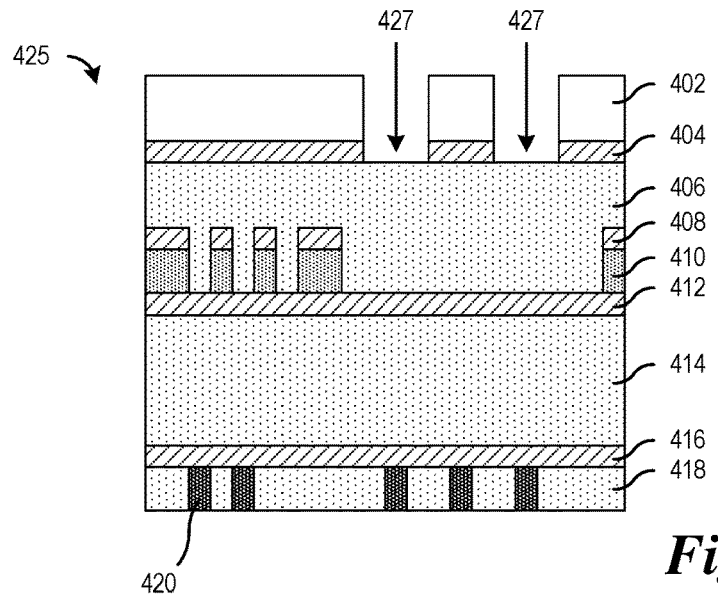

Referring now to FIG. 4B, where wafer 425 illustrates wafer 400 after an etch operation to form openings in ARC layer 404. Openings in PR layer 402, such as opening 424, expose portions of ARC layer 404 to the etch operation. Openings in ARC layer 404 include openings 427.

Figure 4C:
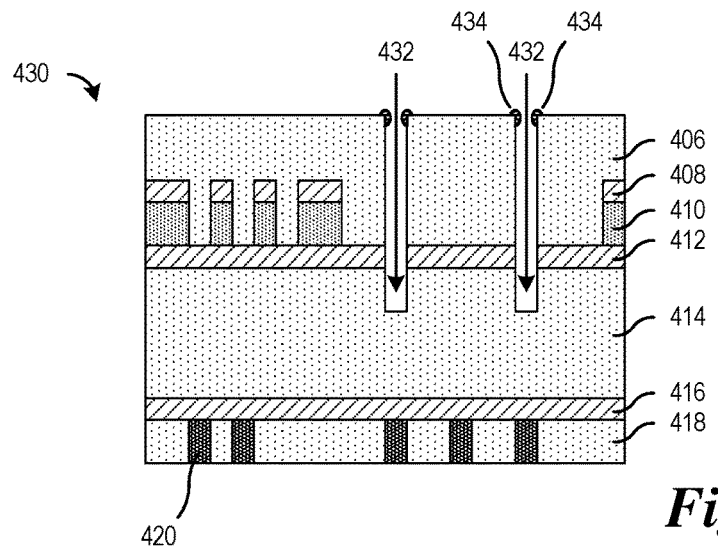

Referring now to FIG. 4C, where wafer 430 illustrates wafer 425 after an etch operation to form openings in organic layer 406, first HM/MHM layer 412, and dielectric layer 414. Openings in ARC layer 404, such as openings 427, expose portions of organic layer 406, first HM/MHM layer 412, and dielectric layer 414, to the etch operation. Openings in organic layer 406, first HM/MHM layer 412, and dielectric layer 414, may be referred to as openings 432. The etch operation also strips PR layer 402 and ARC layer 404.

The highly polymerizing etching chemistries used to limit damage to dielectric materials (e.g., low-k materials) and allow fine control over CD in these etch operations also form by-product residues. The by-product residues may deposit at the top of openings. Example by-product residue deposits (such as by-product residue deposits 434) form at the top of openings 432. However, the by-product residues may also deposit at other locations, including but not limited to the bottoms of openings, along walls of openings, or combinations thereof.

Figure 4D:
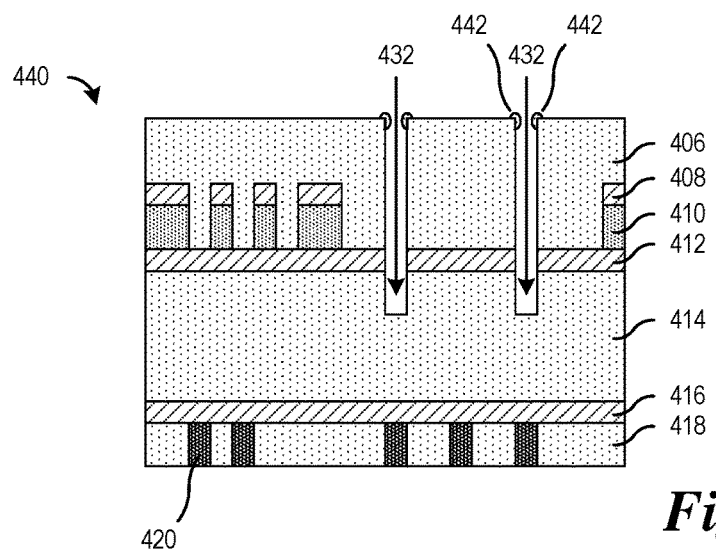

Referring now to FIG. 4D, where wafer 440 illustrates wafer 430 after irradiation with ultra-violet radiation. Irradiation of wafer 430 with the ultra-violet radiation (with a particular wavelength and for a time duration) weakens chemical bonds of the by-product residue deposited on wafer 430 (shown as by-product residue deposits 434 in FIG. 4C). The by-product residue deposits, as weakened by the ultra-violet radiation, are shown as by-product residue deposits 442.

Figure 4E:
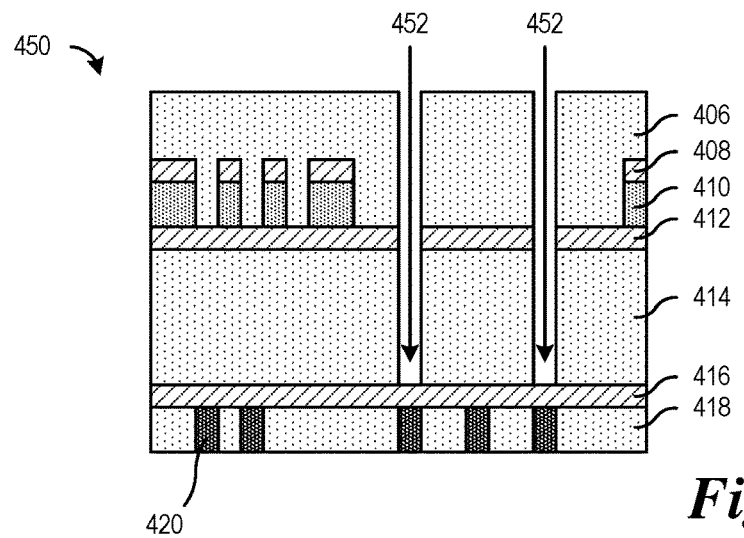

Referring now to FIG. 4E, where wafer 450 illustrates wafer 440 after a continuation of the etch operation to deepen openings in organic layer 406, first HM/MHM layer 412, and dielectric layer 414. The etch operation deepened openings 452 while maintaining a good opening profile because the by-product residue deposits (e.g., by-product residue deposits 442 of FIG. 4D) have been weakened by the ultra-violet radiation and were removed by the continuation of the etch operation.

Figure 4F:
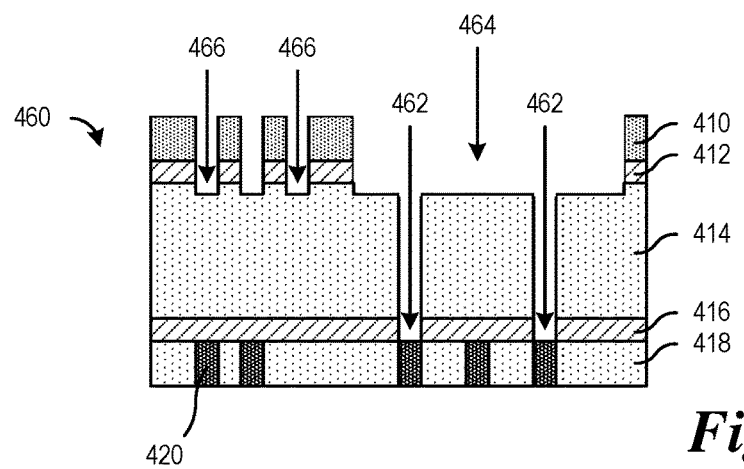

Referring now to FIG. 4F, where wafer 460 illustrates wafer 440 after an organic ash and dielectric HM open operation. The organic ash and dielectric HM open operation stripped organic layer 406 and second HM/MHM layer 408, as well as deepened openings 452 into protective layer 416 (where they are shown in FIG. 4F as openings 462), and formed openings in first HM/MHM layer 412 not covered by contact layer 410 (where they are shown in FIG. 4E as openings 464 and 466).

Figure 4G:
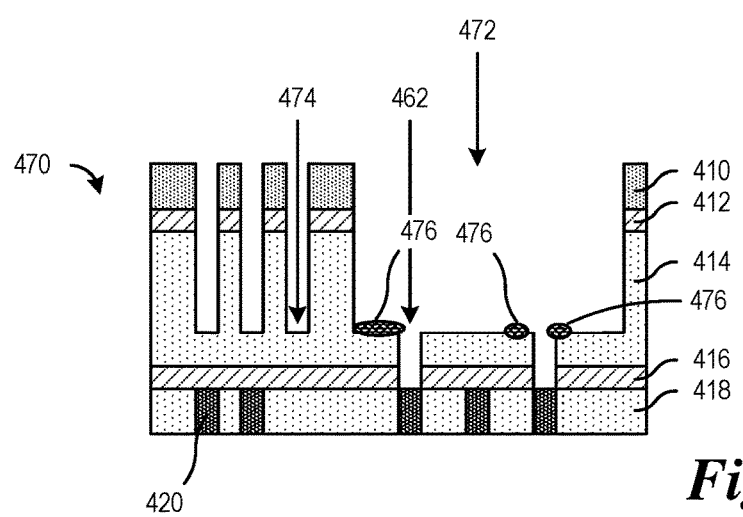

Referring now to FIG. 4G, where wafer 470 illustrates wafer 460 after a trench etch process. The trench etch process deepens openings in dielectric layer 414 under openings (e.g., openings 472 and 474) in contact layer 410. The trench etch process forms by-product residues that can deposit at a variety of locations, such as at the tops of openings (shown as by-product residue deposits 476), bottoms of openings, along walls of openings, or a combination thereof.

Figure 4H:
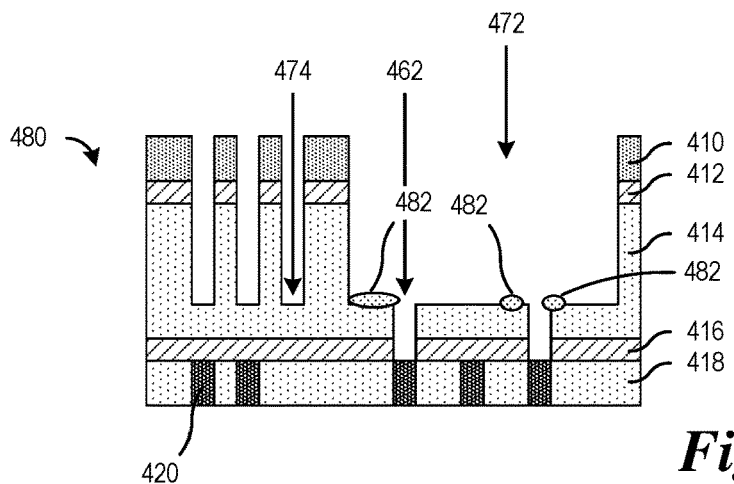

Referring now to FIG. 4H, where wafer 480 illustrates wafer 470 after irradiation with ultra-violet radiation. Irradiation of wafer 470 with the ultra-violet radiation (with a particular wavelength and for a time duration) weakens chemical bonds of the by-product residue deposited on wafer 470 (shown as by-product residue deposits 476 in FIG. 4G). The ultra-violet radiation irradiating wafer 470 may be the same or different from the ultra-violet radiation irradiating wafer 430. The by-product residue deposits, as weakened by the ultra-violet radiation, are shown as by-product residue deposits 482.

Figure 4I:
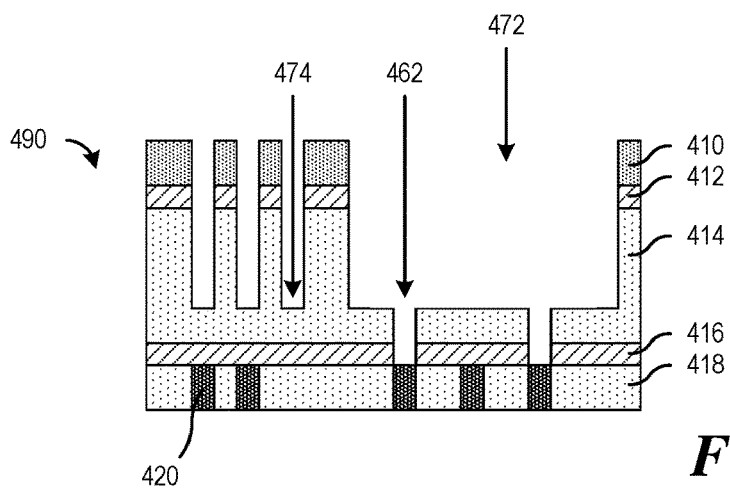

Referring now to FIG. 4I, where wafer 490 illustrates wafer 480 after a PET. The PET, such as a dry de-fluorine or/and wet clean, can help to remove the by-product residue deposits, for example.

FIGS. 5A-5G illustrate example embodiments of a substrate processing flow with ultra-violet radiation to help control by-product residue deposit formation at bottoms and along walls of openings formed during etch operations in accordance with the example embodiments presented herein. The substrate processing flow may be a BEOL dual Damascene process flow, for example. However, the substrate processing flow may be applicable to other substrate process flows, such as subtractive etch process flows.

Figure 5A:
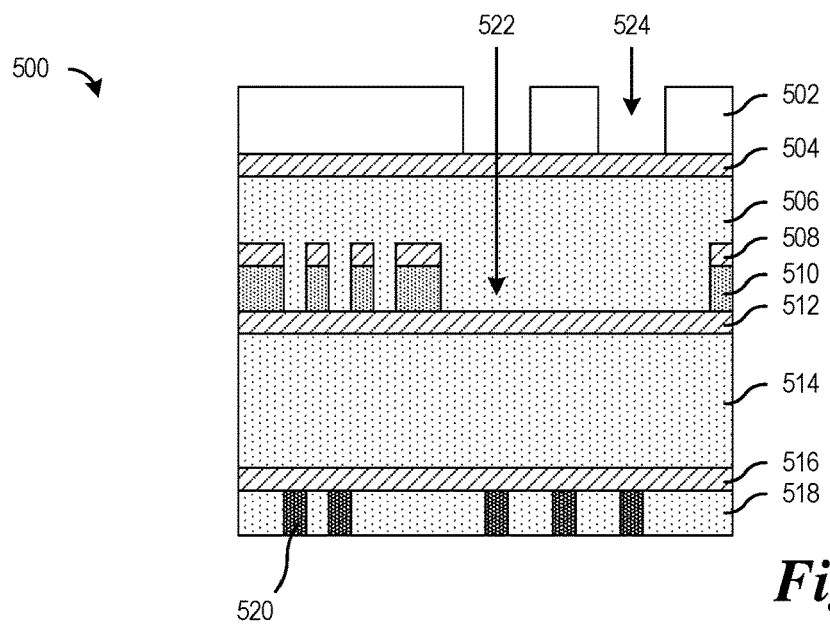
FIGS. 5A-5G illustrate example embodiments of a substrate processing flow with ultra-violet radiation to help control by-product residue deposit formation at bottoms and along walls of openings formed during etch operations in accordance with the example embodiments presented herein.

Referring now to FIG. 5A, where a wafer 500 includes a substrate 518 that includes contacts, such as contact 520. A protective layer 516, such as an ESL, is formed over substrate 518 and the contacts. A dielectric layer 514 is formed over protective layer 516. Dielectric layer 514 may be formed from a material having low-k or ULK properties. A first HM/MHM layer 512 is formed over dielectric layer 514.

A contact layer 510 is formed over first HM/MHM layer 512. A second HM/MHM layer 508 is formed over contact layer 510. Contact layer 510 and second HM/MHM layer 508 are patterned for openings, such as opening 522. The openings may be used to form vias, contacts, etc. An organic layer 506 is formed over second HM/MHM layer 508, filling contact layer 510 and second HM/MHM layer 508. An ARC layer 504 is formed over organic layer 506. A PR layer 502 is formed over ARC layer 504. PR layer 502 is patterned for openings, such as opening 524.

Figure 5B:
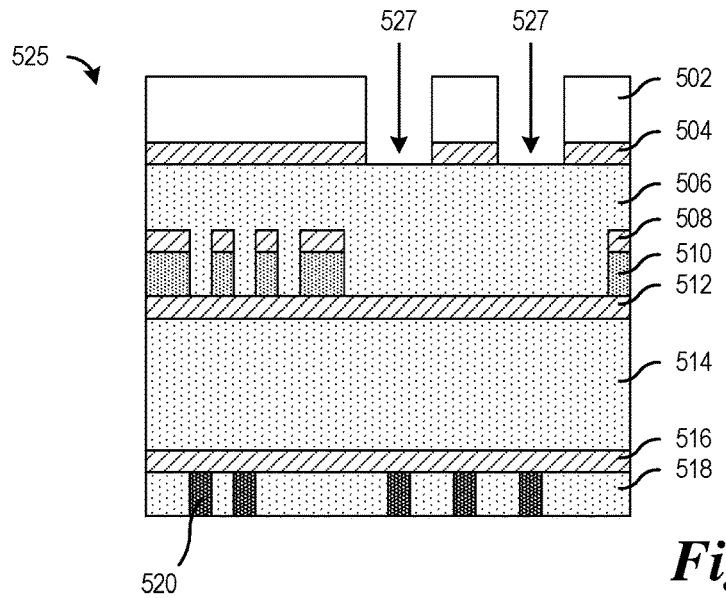

Referring now to FIG. 5B, where wafer 525 illustrates wafer 500 after an etch operation to form openings in ARC layer 504. Openings in PR layer 502, such as opening 524 of FIG. 5A, expose portions of ARC layer 504 to the etch operation. Openings in ARC layer 504 include openings 527.

Figure 5C:
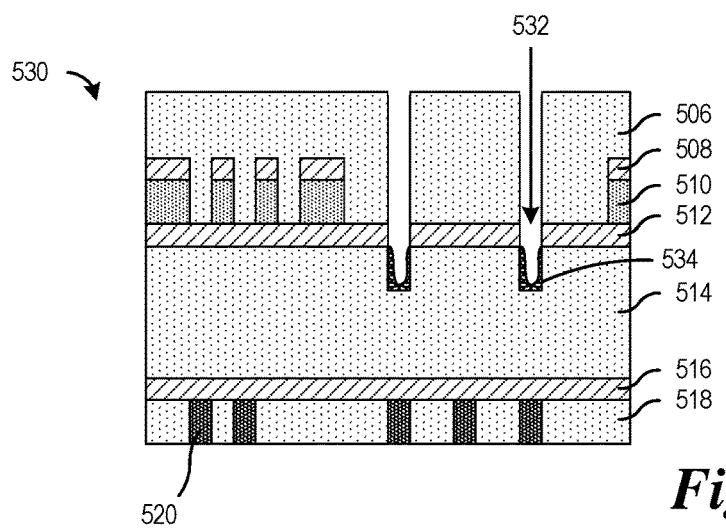

Referring now to FIG. 5C, where wafer 530 illustrates wafer 525 after an etch operation to form openings in organic layer 506, first HM/MHM layer 512, and dielectric layer 514. Openings in ARC layer 504, such as openings 527 of FIG. 5B, expose portions of organic layer 506, first HM/MHM layer 512, and dielectric layer 514, to the etch operation. Openings in organic layer 506, first HM/MHM layer 512, and dielectric layer 514, may be referred to as openings 532. The etch operation also strips PR layer 502 and ARC layer 504.

The highly polymerizing etching chemistries used to limit damage to dielectric materials (e.g., low-k materials) and allow fine control over CD in these etch operations also form by-product residues. The by-product residues may deposit at the bottom of openings or along the walls of openings. Example by-product residue deposits (such as by-product residue deposits 534) form at the bottom of openings 532 and along the walls of openings 532. However, the by-product residues may also deposit at other locations, including but not limited to the tops of openings, or combinations thereof.

Figure 5D:
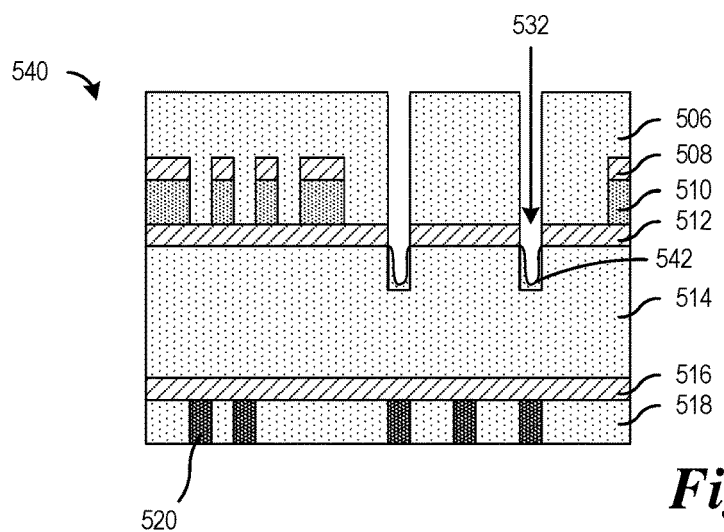

Referring now to FIG. 5D, where wafer 540 illustrates wafer 530 after irradiation with ultra-violet radiation. Irradiation of wafer 530 with the ultra-violet radiation (with a particular wavelength and for a time duration) weakens chemical bonds of the by-product residue deposited on wafer 530 (shown as by-product residue deposits 534 in FIG. 5C). The by-product residue deposits, as weakened by the ultra-violet radiation, are shown as by-product residue deposits 542.

Figure 5E:
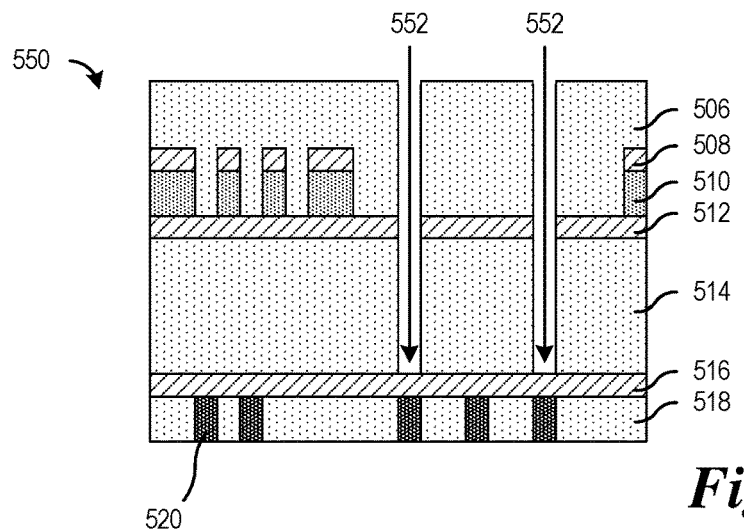

Referring now to FIG. 5E, where wafer 550 illustrates wafer 540 after a continuation of the etch operation to deepen openings in organic layer 506, first HM/MHM layer 512, and dielectric layer 514. The etch operation deepened openings 552 while maintaining a good opening profile because the by-product residue deposits (e.g., by-product residue deposits 542 of FIG. 5D) have been weakened by the ultra-violet radiation and were removed by the continuation of the etch operation.

Figure 5F:
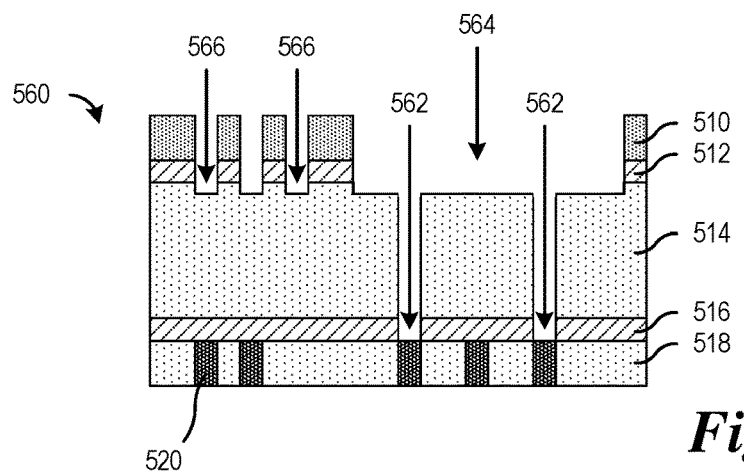

Referring now to FIG. 5F, where wafer 560 illustrates wafer 540 after an organic ash and dielectric HM open operation. The organic ash and dielectric HM open operation stripped organic layer 506 and second HM/MHM layer 508, as well as deepened openings 552 into protective layer 516 (where they are shown in FIG. 5E as openings 562), and formed openings in first HM/MHM layer 512 not covered by contact layer 510 (where they are shown in FIG. 5E as openings 564 and 566).

Figure 5G:
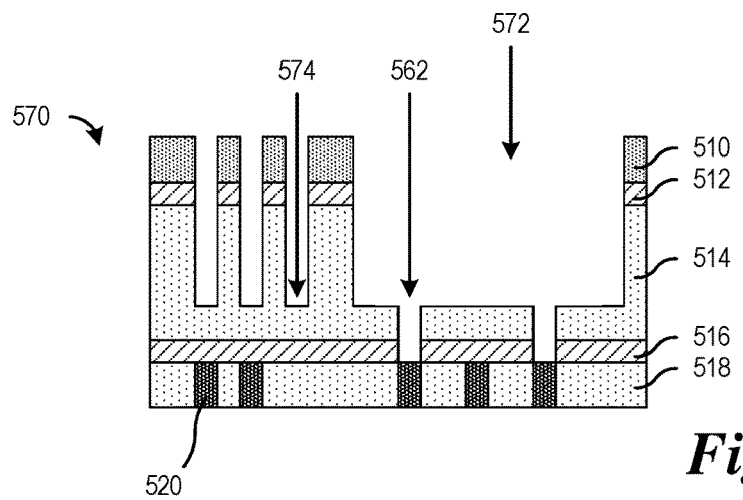

Referring now to FIG. 5G, where wafer 570 illustrates wafer 560 after a trench etch process. The trench etch process deepens openings in dielectric layer 514 under openings (e.g., openings 572 and 574) in contact layer 510. The trench etch process is shown in FIG. 5G as not producing any by-product residues. Potentially, the trench etch process is not utilizing a highly depositing etch chemistry, such as any one of the examples discussed previously. However, it is possible that the trench etch process forms by-product residues that can deposit at a variety of locations, such as at the tops of openings, bottoms of openings, along walls of openings, or a combination thereof, such as shown in FIG. 5G.

Although FIGS. 5A-5G do not illustrate additional process steps, other process steps are possible, including but not limited to PETs, cleanings, etc.

According to an embodiment, the substrate is irradiated with the ultra-violet radiation in a device separate from an etch chamber used to etch the substrate. As an example, the substrate is etched in an etch chamber, while the substrate is irradiated in an ultra-violet treatment device. According to an embodiment, the substrate is irradiated with the ultra-violet radiation in a device in a separate processing apparatus from an etch chamber used to etch the substrate. In other words, after etching in an etch chamber, the substrate is transported to another processing apparatus for ultra-violet radiation irradiation. If there is a subsequent etch processing, the substrate may be transported back to the etch chamber or another etch chamber (which may be in yet another processing apparatus).

Figure 6:
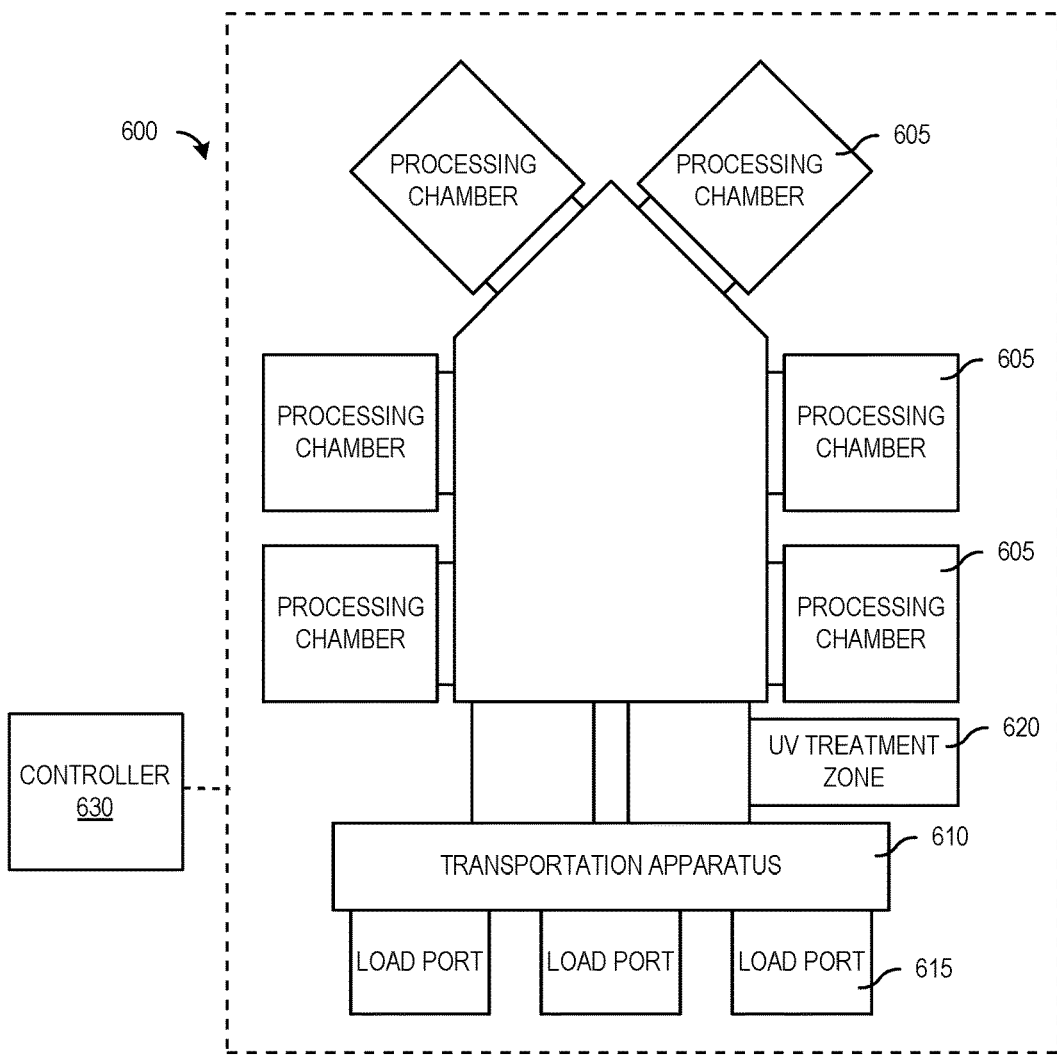
FIG. 6 illustrates an example substrate processing apparatus in accordance with the example embodiments presented herein.

FIG. 6 illustrates an example substrate processing apparatus 600 in accordance with the example embodiments presented herein. Substrate processing apparatus 600 is a multi-chamber substrate processing apparatus capable of processing multiple substrates at one time. Substrate processing apparatus 600 includes a plurality of processing chambers 605, with each processing chamber providing etch processing for a substrate. Plurality of processing chambers 605 share a transportation apparatus 610 and a plurality of loading ports 615. Transportation apparatus 610 moves substrates between different stations of substrate processing apparatus 600, such as the process chambers and loading ports.

Substrate processing apparatus 600 also includes an ultra-violet treatment zone 620. Ultra-violet treatment zone 620 also irradiates substrates with ultra-violet radiation during storage or transportation. In addition, in certain embodiments, the ultra-violet treatment zone 620 is configured to apply a $N_2$ purge treatment to the wafer during storage. The ultra-violet radiation may have a range of wavelengths and the exposure of the substrates to the ultra-violet radiation may be for a range of doses or durations. In various embodiments, the wavelength of the ultra-violet radiation is between 100 nm and 200 nm, for example, 100 nm and 200 nm range or range 150 nm and 200 nm range in example embodiments. The inventors of this application have determined that this wavelength range is best for removing residues formed during etching.

A substrate may be irradiated with ultra-violet radiation before an etch treatment or after an etch treatment. As an example, the substrate is irradiated with ultra-violet radiation in ultra-violet treatment zone 620 before being transported by transportation apparatus 610 to a processing chamber 605 for etch treatment. As another example, the substrate is transported by transportation apparatus 610 from a processing chamber 605 to ultra-violet treatment zone 620, where the substrate is irradiated with ultra-violet radiation.

A controller 630 coupled (shown as a dot-dashed line) to various components of substrate processing apparatus 600 (such as processing chambers, ultra-violet treatment zone 620, transportation apparatus 610, and so on) or sensors (e.g., sensors located in or on processing chambers, transportation apparatus 610, and so forth) is capable of measuring an operating variable, such as a presence or profile of by-product residue. Controller 630 makes use of the measurement of the operating variable to adjust the ultra-violet radiation to help remove the by-product residue. As an example, controller 630 adjusts the ultra-violet radiation emitted by ultra-violet radiation sources of ultra-violet treatment zone 620 to help remove the by-product residue, by controlling parameters of the ultra-violet radiation, such as the ultra-violet radiation wavelength range, dose, duration, or a combination thereof.

As an example, controller 630 is coupled to a sensor (e.g., a metrology device, such as an inline spectrometer or reflectometer) to measure the presence and/or amount of by-product residue and controller 630 adjusts one or more parameters of the ultra-violet radiation, such as the ultra-violet radiation wavelength range, dose, duration, or a combination thereof.

Figure 7A:
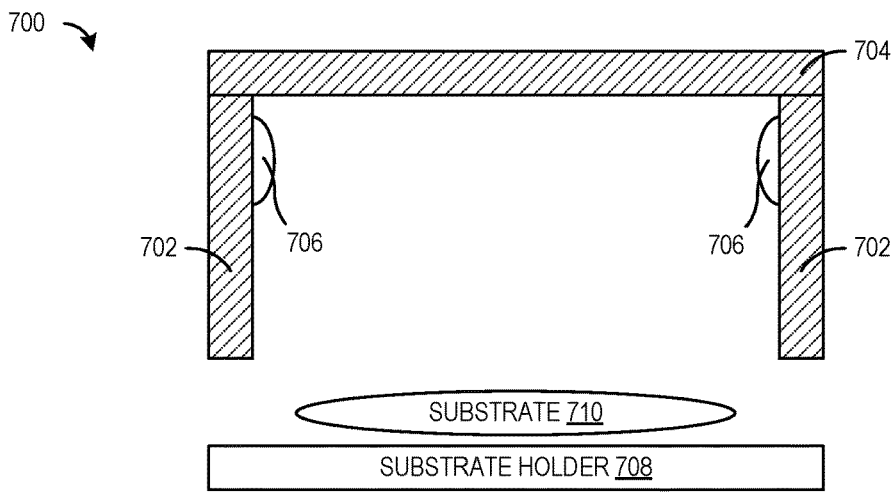
FIG. 7A illustrates a side view of a first example ultra-violet treatment zone in accordance with example embodiments presented herein.

FIG. 7A illustrates a side view of a first example ultra-violet treatment zone 700 in accordance with example embodiments presented herein. Ultra-violet treatment zone 700 includes walls 702 and top 704, where ultra-violet radiation sources 706 are disposed on interior surfaces of walls 702. A substrate holder 708 with a substrate 710 moves into position within ultra-violet treatment zone 700. Ultra-violet radiation sources 706 irradiate substrate 710 with ultra-violet radiation. Although shown in FIG. 7A as having two ultra-violet radiation sources, the number of ultra-violet radiation sources may differ.

Although shown in FIG. 7A as being disposed on the interior surface of walls 702, ultra-violet radiation sources 706 may alternatively be disposed on an exterior surface of walls 702 with openings formed in walls 702 to allow the ultra-violet radiation to enter ultra-violet treatment zone 700. The openings in walls 702 may be protected with a protective mechanism (such as a protective cover of an ultra-violet transparent material such as quartz, fused silicon, fluorites such as calcium fluorite, borosilicate glass, and other materials). Ultra-violet radiation sources 706 may alternatively be distal to walls 702 with openings formed in walls 702 to allow the ultra-violet radiation to enter ultra-violet treatment zone 700. The ultra-violet radiation may be transmitted (e.g., over the air or through a waveguide) into ultra-violet treatment zone 700 or a pipe mechanism disposed between ultra-violet radiation sources 706 and ultra-violet treatment zone 700 pipe (e.g., transmit through a waveguide) the ultra-violet radiation into ultra-violet treatment zone 700. The openings in walls 702 may be protected with a protective mechanism.

In an embodiment, in situations when ultra-violet treatment zone 700 includes multiple ultra-violet radiation sources, the multiple ultra-violet radiation sources are configured to produce ultra-violet radiation with the same wavelength or same range of wavelengths (e.g., 100 nm and 200 nm or 150 nm and 200 nm). In an embodiment, in situations when ultra-violet treatment zone 700 includes multiple ultra-violet radiation sources, individual ultra-violet radiation sources may be configured to produce different ultra-violet radiation. As an example, a first ultra-violet radiation source produces ultra-violet radiation at a first wavelength and a second ultra-violet radiation source produces ultra-violet radiation at a second wavelength. As another example, a first ultra-violet radiation source produces ultra-violet radiation at a first intensity and a second ultra-violet radiation source produces ultra-violet radiation at a second intensity. It is possible for different ultra-violet radiation sources to produce ultra-violet radiation with different wavelengths, range of wavelengths, intensities, doses, durations, and so forth.

In an embodiment, the ultra-violet radiation sources are arranged about the ultra-violet treatment zone 700 so that ultra-violet radiation sources emit ultra-violet radiation with a substantially uniform distribution over the entire surface of the substrate. As an example, the ultra-violet radiation is said to emit ultra-violet radiation with a substantially uniform distribution when the intensity of the ultra-violet radiation incident on the surface of the substrate at different locations on the substrate varies by less than a specified threshold. Examples of specified threshold may be 5%, 10%, 15%, and so on. By providing a substantially uniform illumination, within wafer non-uniformity is reduced. In addition, the phase difference and wavelength of the different lights are maintained to prevent hotspots due to constructive and destructive interference. Further, the ultra-violet radiation sources are designed to avoid having a single focal point on the surface of the substrate being exposed to minimize the formation of diffraction patterns on the substrate. In addition, when multiple ultra-violet radiation sources are used, they may not be all turned on at the same time. Rather, they may be 100% off-phase in certain embodiments to reduce interference effects, for example, by controlling the ultra-violet radiation sources with different pulse trains that are out of phase.

Figure 7B:
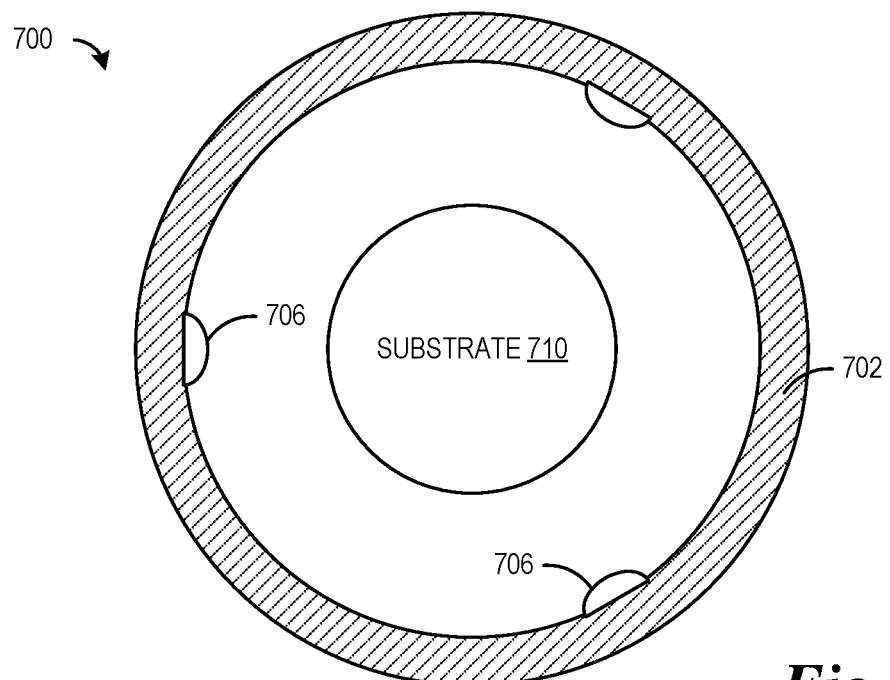
FIG. 7B illustrates a top view of first example ultra-violet treatment zone in accordance with example embodiments presented herein.

FIG. 7B illustrates a top view of first example ultra-violet treatment zone 700 in accordance with example embodiments presented herein. Ultra-violet treatment zone 700 includes ultra-violet radiation sources 706 arranged in an annular arrangement on an interior surface of wall 702 around substrate 710. Although shown in FIG. 7B as having three ultra-violet radiation sources, the number of ultra-violet radiation sources may differ. Alternatively, ultra-violet treatment zone 700 includes ultra-violet radiation sources 706 arranged in an annular arrangement on an exterior surface of wall 702 around substrate 710, with openings in wall 702 to allow the ultra-violet radiation to enter ultra-violet treatment zone 700. The openings may be protected with a protective mechanism. Alternatively, ultra-violet treatment zone 700 includes ultra-violet radiation sources 706 that are located outside the exterior surface of wall 702 around substrate 710, with openings in wall 702 to allow the ultra-violet radiation to enter ultra-violet treatment zone 700. In such a deployment, the ultra-violet radiation may be transmitted over the air or piped in through the openings in wall 702.

Figure 7C:
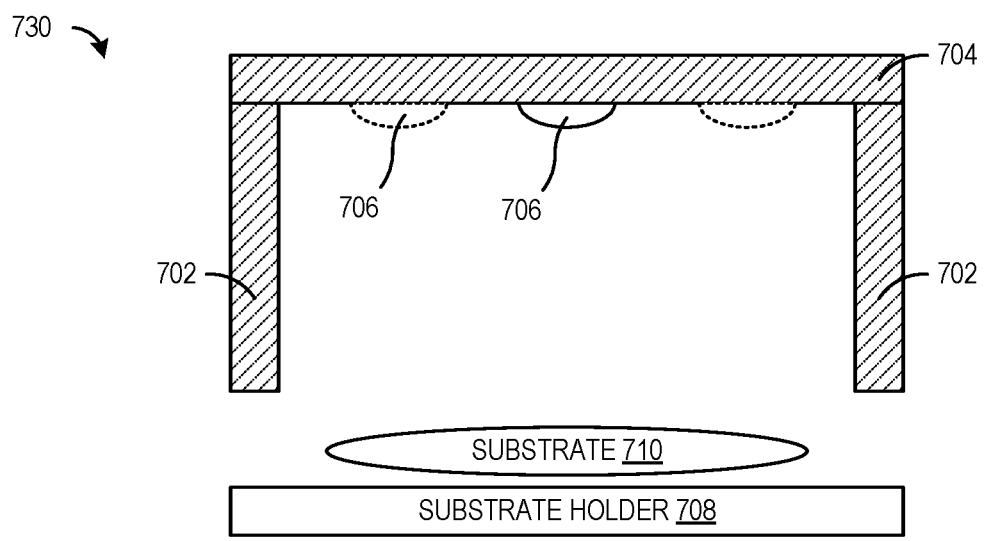
FIG. 7C illustrates a side view of a second example ultra-violet treatment zone in accordance with example embodiments presented herein.

FIG. 7C illustrates a side view of a second example ultra-violet treatment zone 730 in accordance with example embodiments presented herein. Ultra-violet treatment zone 730 includes walls 702 and top 704, where ultra-violet radiation sources 706 are disposed on an interior surface of top 704. A substrate holder 708 with a substrate 710 moves into position within ultra-violet treatment zone 730. Ultra-violet radiation sources 706 irradiate substrate 710 with ultra-violet radiation. Alternatively, ultra-violet treatment zone 730 includes walls 702 and top 704, where ultra-violet radiation sources 706 are disposed on an exterior surface of top 704, with openings in top 704 to allow the ultra-violet radiation to enter ultra-violet treatment zone 730. The openings may be protected with a protective mechanism. Alternatively, ultra-violet treatment zone 730 includes ultra-violet radiation sources 706 that are distal to exterior surface of top 704, with openings in top 704 to allow the ultra-violet radiation to enter ultra-violet treatment zone 730. In such a deployment, the ultra-violet radiation may be transmitted over the air or piped in through the openings in top 704.

FIG. 7D illustrates a view of the top of ultra-violet treatment zone 730 highlighting a first example arrangement of ultra-violet radiation sources 740 in accordance with example embodiments presented herein. Ultra-violet radiation sources 706 are arranged in an annular arrangement on the underside of top 704. An alternative to first example arrangement of ultra-violet radiation sources includes an ultra-violet radiation source 742 disposed in about the middle of top 704. As discussed previously, ultra-violet radiation sources 706 may be on the upper side of top 704. Although shown in FIG. 7D as having four (or five) ultra-violet radiation sources, the number of ultra-violet radiation sources may differ. Furthermore, not all of the ultra-violet radiation sources need to be emitting ultra-violet radiation at any given time.

FIG. 7E illustrates a view of the top of ultra-violet treatment zone 730 highlighting a second example arrangement of ultra-violet radiation sources 750 in accordance with example embodiments presented herein. Ultra-violet radiation sources 706 are arranged in a rectangular arrangement on the underside of top 704. An alternative to second example arrangement of ultra-violet radiation sources includes an ultra-violet radiation source 752 disposed in about the middle of top 704. As discussed previously, ultra-violet radiation sources 706 may be on the upper side of top 704. Although shown in FIG. 7E as having four (or five) ultra-violet radiation sources, the number of ultra-violet radiation sources may differ. Furthermore, not all of the ultra-violet radiation sources need to be emitting ultra-violet radiation at any given time.

Figure 8:
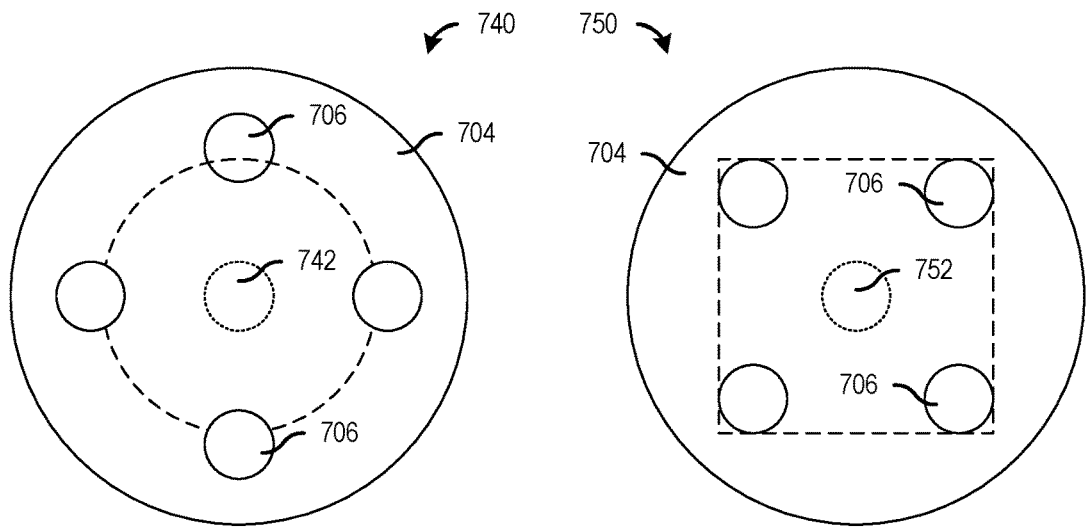
FIG. 8 illustrates a flow diagram of an example substrate process with ultra-violet radiation to assist in by-product residue removal in accordance with example embodiments presented herein.
Figure 8:
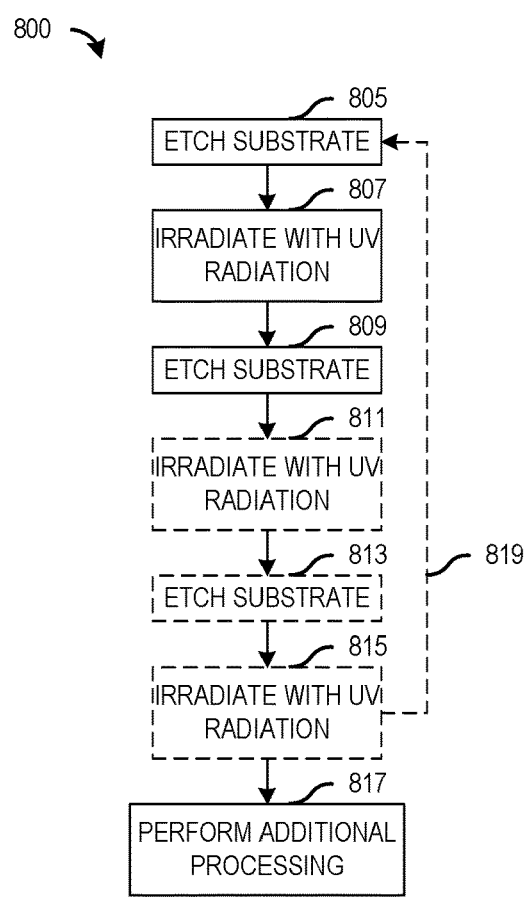

FIG. 8 illustrates a flow diagram of an example substrate process 800 with ultra-violet radiation to assist in by-product residue removal in accordance with example embodiments presented herein. Substrate process 800 may be indicative of operations occurring in the processing of a substrate. Substrate process 800 may be a BEOL process or a FEOL process.

Substrate process 800 begins with etching the substrate (block 805). The substrate may be etched using a RIE with highly polymerizing chemistries, for example. The substrate is irradiated with ultra-violet radiation (block 807). The ultra-violet radiation may have a particular wavelength or a range of wavelengths. The irradiation may be for a specified dose or duration. In an embodiment, the irradiation with the ultra-violet radiation occurs after the etching of the substrate in block 805. In an embodiment, after etching in a processing apparatus, the substrate is transported to a different portion of the processing apparatus or to an entirely different processing apparatus for ultra-violet radiation irradiation.

After the ultra-violet radiation irradiation, the substrate is etched (block 809). In an embodiment, the substrate etch is a continuation of the etching of block 805. The continued etch deepens openings formed by the etching of block 805. In an embodiment, the substrate etch is a new etch of the substrate. The new etch may be different etch technology or a different etch chemistry, for example. In an embodiment, after irradiation with ultra-violet radiation, the substrate is transported back to the same processing apparatus used to etch the substrate in block 805 or to yet another processing apparatus for etching in block 809.

Optionally, after the substrate etch of block 809, the substrate may be irradiated with ultra-violet radiation (block 811). In an embodiment, the ultra-violet radiation of block 811 is the same (i.e., same wavelength or range of wavelengths, and same time duration) as the ultra-violet radiation of block 807. In an embodiment, the ultra-violet radiation of block 811 is different (i.e., different wavelength or range of wavelengths, different time duration, or different wavelength and different time duration) as the ultra-violet radiation of block 807.

Substrate process 800 continues with additional processing (block 817). Additional processing of the substrate may include cleaning, wet cleaning, PET, etc.

In an embodiment, the substrate etch of block 805 and the ultra-violet radiation irradiation of block 807 defines a process cycle. Similarly, the substrate etch of block 809 and the ultra-violet radiation irradiation of block 811 defines another process cycle. Substrate process 800 may then be described as being cyclic in nature, with one or more process cycles. Although not discussed, substrate process 800 may include additional process cycles, such as blocks 813 and 815.

In further embodiments, one or more processes described above may be performed cyclically as illustrated by the dashed loop 819.

FIG. 9A illustrates a cross sectional view of a first example plasma processing apparatus 900 with ultra-violet radiation sources disposed on sidewalls of a plasma etch chamber in accordance with example embodiments presented herein. Plasma processing apparatus 900 may be used for operations such as ashing, etching, deposition including atomic layer deposition, chemical vapor deposition, physical vapor deposition, cleaning, plasma polymerization, and so on. As shown in FIG. 9A, the plasma etch chamber includes a pair of RF electrodes.

Plasma processing apparatus 900 includes a plasma etch chamber 902 that provides a space for plasma generation, and a substrate holder 904 that enables the mounting of a substrate 906 to be processed. Substrate 906 may be moved into plasma etch chamber 902 through a loading or unloading port. A transportation apparatus moves substrate 906 to and from plasma etch chamber 902, for example. Substrate holder 904 includes an electrostatic chuck to hold substrate 906. Substrate holder 904 may also include built-in heaters and coolers controlled by a feedback temperature control system 908.

Plasma processing apparatus 900 includes a first radio frequency (RF) electrode 910, referred to herein as top electrode, which is located near the top of plasma processing apparatus 900. The top electrode may be placed within the plasma etch chamber 902 or in certain embodiments, may be placed outside the plasma etch chamber 902 and coupled to the plasma through a dielectric (e.g., quartz) window. Plasma processing apparatus 900 also includes second RF electrode that comprises substrate holder 904 fitted with RF taps 912. Collectively, substrate holder 904 and RF taps 912 are referred to as lower RF electrode 914.

When an electrostatic force is applied to lower RF electrode 914, an electrostatic force is generated and attracts substrate 906 to substrate holder 904. Lower RF electrode 914 may also electrically connected to a high frequency power source that provides a high frequency voltage to cause ions in a plasma to be attracted to substrate 906. Sidewall 916, base 918, and top cover 920 of plasma etch chamber 902 may be made of a conductive material and is either electrically grounded or floating.

Processing gas from a process gas supply flows through a gas input system comprising a showerhead 922 in top cover 920, and inlets 923 in sidewalls 916. Process gas may flow from showerhead 922 and through or around upper electrode 910, as well as through inlets 923. Process gas may exit through outlets 924 in base 918. Vacuum pumps 926 may be used to control the pressure in etch chamber 902 and to remove exhaust gases such as product gases from plasma etch chamber 902. Processing gases are also referred to as reactant gases. A high frequency power source provides a high frequency voltage to power and sustain the plasma and steer ions in the plasma to substrate 906.

Plasma processing apparatus 900 also includes ultra-violet radiation sources 928 disposed on sidewalls 916 of plasma etch chamber 902. Each one of ultra-violet radiation sources 928 comprises lamp 940 (i.e., a source of the ultra-violet radiation), a lens mechanism 942 (to focus or otherwise optically manipulate the ultra-violet radiation), electrical connections 944 to the lamp (to power the lamp), and a protective mechanism 946 (such as a cover that is transparent to the ultra-violet radiation, to protect lamp 940, lens mechanism 942, and electrical connections 944). Examples of protective mechanism 946 include covers made of quartz or other silicate glasses with particular surface coatings. Highlight 930 provides a detailed view of an example ultra-violet radiation source. In an embodiment, ultra-violet radiation sources 928 are attached to sidewalls 916 of plasma etch chamber 902. In other words, ultra-violet radiation sources 928 jut into plasma etch chamber 902, with one or more holes in sidewalls 916 to allow for pass-through of electrical connections 944. In an embodiment, ultra-violet radiation sources 928 are imbedded in sidewalls 916 of plasma etch chamber 902. In such a deployment, openings in sidewalls 916 (which is protected by protective mechanism 946) allows the ultra-violet radiation emitted by an ultra-violet radiation source to enter plasma etch chamber 902. In an embodiment, ultra-violet radiation sources 928 are attached to the outside of sidewalls 916 of plasma etch chamber 902. In such a deployment, openings in sidewalls 916 (which is protected by protective mechanism 946) allows the ultra-violet radiation emitted by an ultra-violet radiation source to enter plasma etch chamber 902. In an embodiment, ultra-violet radiation sources 928 are located outside of sidewalls 916, e.g., remote from the plasma processing chamber. In such a deployment, the ultra-violet radiation emitted by ultra-violet radiation sources 928 may be transmitted (e.g., over the air) into plasma etch chamber 902 through lens mechanism 942 and protective mechanism 946. In another embodiment, a pipe mechanism (e.g., a waveguide) disposed between lamp 940 and lens mechanism 942 transmits the ultra-violet radiation from lamp 940 and to lens mechanism 942 and protection mechanism 946 into plasma etch chamber 902. In an embodiment, the protective mechanism 946 may be a protective cover made of an ultra-violet transparent material such as quartz, fused silicon, fluorites such as calcium fluorite, borosilicate glass, and other materials.

In further embodiments, lamps 940 located at different locations may emit radiation of different wavelength or phases to achieve uniform illumination energy across the substrate being processed to avoid destructive interference and minimize dark spots. Although in certain embodiments, the lamps 940 located at different locations may emit radiation of the same wavelength and phases. The controller 948 discussed further below helps to maintain a fixed phase difference between the radiation emitter by different lamps 940.

A controller 948 coupled (shown as a dot-dashed line) to various components of plasma processing apparatus 900 (such as substrate holder 904, feedback temperature control system 908, electrodes 910 and 914, showerhead 922, vacuum pumps 926, ultra-violet radiation sources 928, and so on) or sensors (e.g., sensors located in or on plasma etch chamber 902, substrate holder 904, feedback temperature control system 908, electrodes 910 and 914, showerhead 922, inlets 923, outlets 924, pumps 926, ultra-violet radiation sources 928, and so forth) is capable of measuring an operating variable, such as a presence or profile of by-product residue. Controller 948 makes use of the measurement of the operating variable to adjust the ultra-violet radiation to help remove the by-product residue. As an example, controller 948 adjusts the ultra-violet radiation emitted by ultra-violet radiation sources 928 to help remove the by-product residue, by controlling parameters of the ultra-violet radiation, such as the ultra-violet radiation wavelength range, dose, duration, or a combination thereof.

As an example, controller 948 is coupled to a sensor (e.g., a metrology device, such as an inline spectrometer or reflectometer) to measure the presence and/or amount of by-product residue and controller 948 adjusts one or more parameters of the ultra-violet radiation, such as the ultra-violet radiation wavelength range, dose, duration, or a combination thereof.

In an embodiment, each lamp 940 produces the same ultra-violet radiation (e.g., same wavelength, range of wavelengths, or doses). In an embodiment, each one of ultra-violet radiation sources 928 includes a plurality of lamps 940, with the lamps capable of producing ultra-violet radiation at different wavelengths, range of wavelengths, or doses. In an embodiment, the lens mechanism 942 is fixed. In an embodiment, the lens mechanism 942 is adjustable to manipulate the ultra-violet radiation as needed.

Ultra-violet radiation sources 928 produce ultra-violet radiation at a particular wavelength (or in a range of wavelengths) for a specified dose or duration. In an embodiment, different ultra-violet radiation sources 928 produce ultra-violet radiation at the same wavelength, same range of wavelengths, or same doses. In an embodiment, different ultra-violet radiation sources 928 produce different ultra-violet radiation (e.g., different wavelengths, different ranges of wavelengths, or different durations or doses). As an example, a first ultra-violet radiation source produces ultra-violet radiation at a first wavelength and a second ultra-violet radiation source produces ultra-violet radiation at a second wavelength. As another example, a first ultra-violet radiation source produces ultra-violet radiation at a first intensity and a second ultra-violet radiation source produces ultra-violet radiation at a second intensity. It is possible for different ultra-violet radiation sources to produce ultra-violet radiation with different wavelengths, range of wavelengths, intensities, durations, doses, and so forth.

In an embodiment, ultra-violet radiation sources 928 are arranged about sidewall 916 of plasma etch chamber 902 so that ultra-violet radiation sources 928 emit ultra-violet radiation with a substantially uniform distribution over the entire surface of substrate 906. As an example, the ultra-violet radiation is said to emit ultra-violet radiation with a substantially uniform distribution when the intensity of the ultra-violet radiation incident on the surface of the substrate at different locations on the substrate varies by less than a specified threshold. Examples of specified threshold may be 5%, 10%, 15%, and so on. By providing a substantially uniform illumination, within wafer non-uniformity is reduced. In addition, the phase difference and wavelength of the different lights are maintained to prevent hotspots due to constructive and destructive interference. Further, the ultra-violet radiation sources are designed to avoid having a single focal point on the surface of the substrate being exposed to minimize the formation of diffraction patterns on the substrate. In addition, when multiple ultra-violet radiation sources are used, they may not be all turned on at the same time. Rather, they may be 100% off-phase in certain embodiments to reduce interference effects, for example, by controlling the ultra-violet radiation sources with different pulse trains that are out of phase.

In various embodiments, the wavelength of the ultra-violet radiation is between 100 nm and 400 nm, for example, 100 nm and 200 nm range or 150 nm and 200 nm range in example embodiments. The inventors of this application have determined that this wavelength range is best for removing by-product residues formed during etching.

In an embodiment, ultra-violet radiation sources 928 are arranged in an annular configuration around sidewall 916 of plasma etch chamber 902. In an embodiment, ultra-violet radiation sources 928 are equidistant to substrate 906. In an embodiment, ultra-violet radiation sources 928 are arranged so that some ultra-violet radiation sources are closer to substrate 906 than others.

Figure 9B:
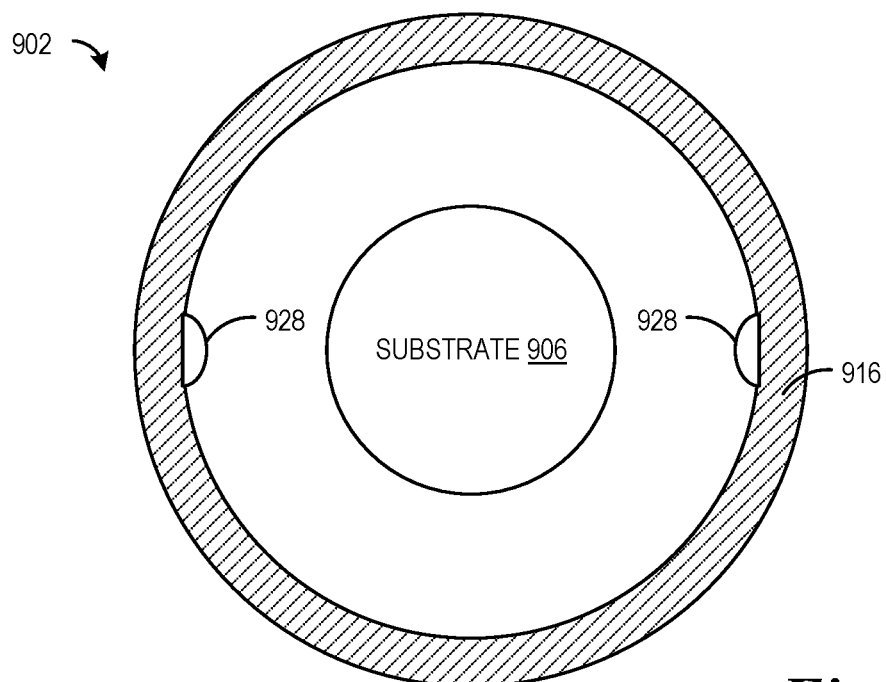
FIG. 9B illustrates a top view of a first example plasma etch chamber in accordance with example embodiments presented herein.

FIG. 9B illustrates a top view of a first example plasma etch chamber 902 in accordance with example embodiments presented herein. Plasma etch chamber 902 includes two ultra-violet radiation sources 928 arranged in an annular arrangement on sidewall 916 of plasma etch chamber 902 around substrate 906. Although shown in FIG. 9B as having two ultra-violet radiation sources, the number of ultra-violet radiation sources may differ.

Figure 9C:
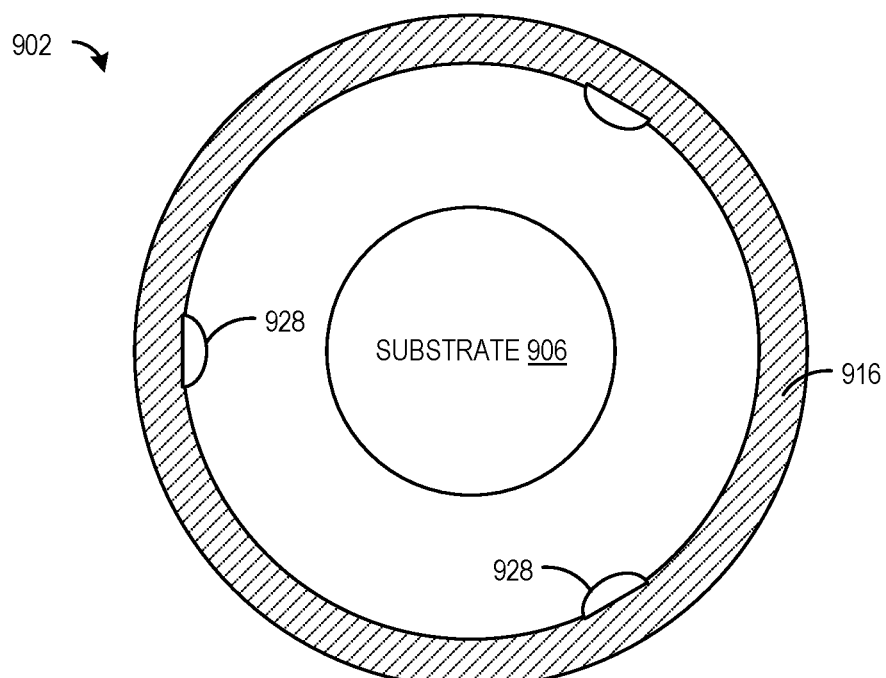
FIG. 9C illustrates a top view of a second example plasma etch chamber in accordance with example embodiments presented herein.

FIG. 9C illustrates a top view of a second example plasma etch chamber 902 in accordance with example embodiments presented herein. Plasma etch chamber 902 includes three ultra-violet radiation sources 928 arranged in an annular arrangement on sidewall 916 of plasma etch chamber 902 around substrate 906. Although shown in FIG. 9C as having three ultra-violet radiation sources, the number of ultra-violet radiation sources may differ, for example, be more than three.

Figure 10A:
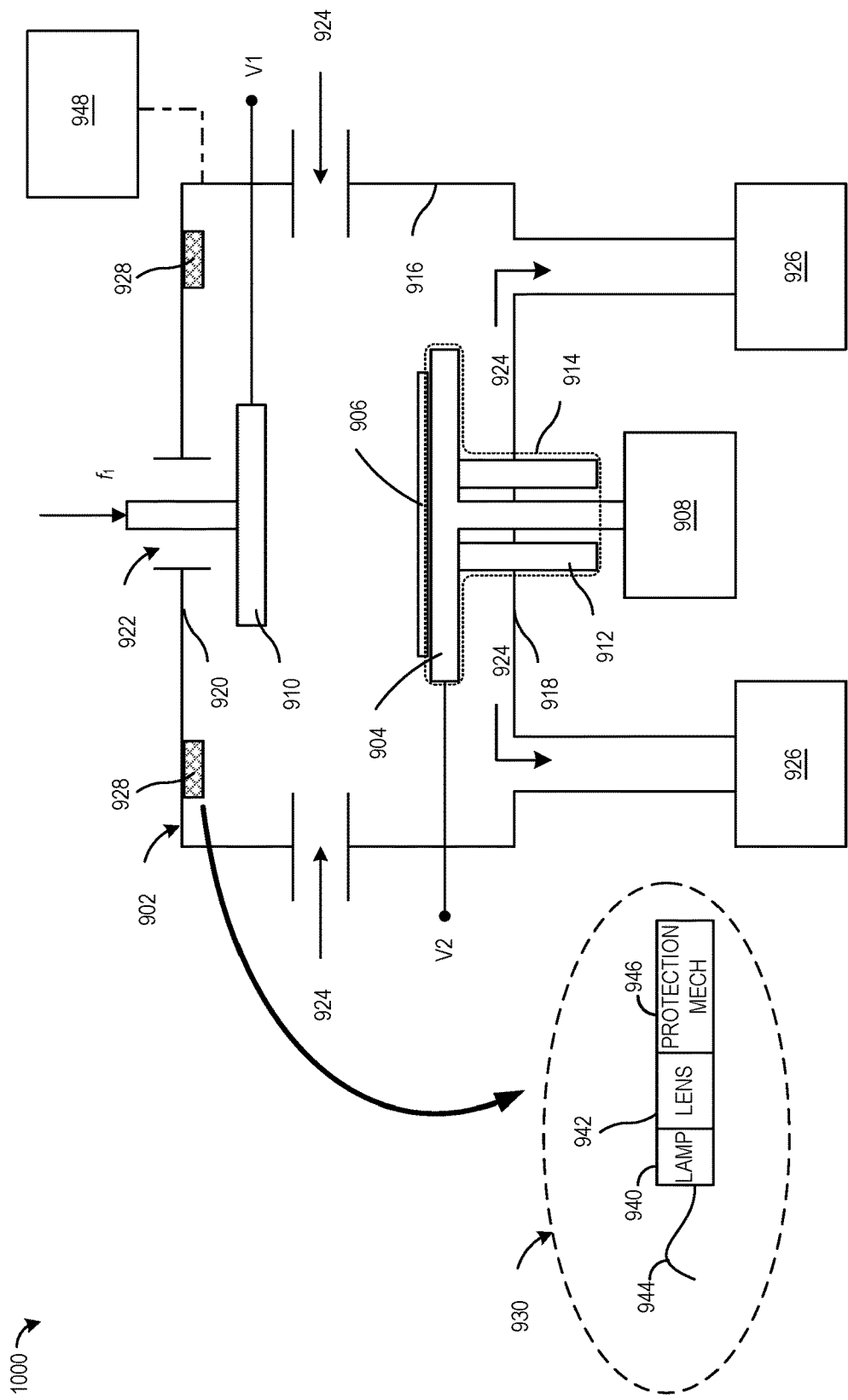
FIG. 10A illustrates a cross sectional view of a second example plasma processing apparatus with ultra-violet radiation sources disposed on a top cover of a plasma etch chamber in accordance with example embodiments presented herein.

FIG. 10A illustrates a cross sectional view of a second example plasma processing apparatus 1000 with ultra-violet radiation sources disposed on a top cover of a plasma etch chamber in accordance with example embodiments presented herein. Features of plasma processing apparatus 1000 are labeled with reference numerals. In situations where the reference numerals used in FIG. 10A are similar to reference numerals used in FIG. 9A, the features serve similar function.

Plasma processing apparatus 1000 includes ultra-violet radiation sources 928 disposed on top cover 920 of plasma etch chamber 902. Ultra-violet radiation sources 928 may be positioned or designed to not impede the flow of process gases. Ultra-violet radiation sources 928 produce ultra-violet radiation at a particular wavelength (or in a range of wavelengths) for a specified dose or duration. In an embodiment, different ultra-violet radiation sources 928 produce ultra-violet radiation at the same wavelength, same range of wavelengths, or same doses or durations. In an embodiment, different ultra-violet radiation sources 928 produce different ultra-violet radiation (e.g., different wavelengths, different ranges of wavelengths, or different doses or durations).

In an embodiment, ultra-violet radiation sources 928 are arranged about top cover 920 of plasma etch chamber 902 so that ultra-violet radiation sources 928 emit ultra-violet radiation with a substantially uniform distribution over the entire surface of substrate 906. In an embodiment, ultra-violet radiation sources 928 are arranged in an annular configuration about top cover 920 of plasma etch chamber 702. In an embodiment, ultra-violet radiation sources 928 are arranged in a rectangular configuration about top cover 920 of plasma etch chamber 902.

In an embodiment, ultra-violet radiation sources 928 are attached to top cover 920 of plasma etch chamber 902. In other words, ultra-violet radiation sources 928 jut into plasma etch chamber 902, with one or more holes in top cover 920 to allow for pass-through of electrical connections 944. In an embodiment, ultra-violet radiation sources 928 are imbedded in top cover 920 of plasma etch chamber 902. In such a deployment, an opening in top cover 920 (which is protected by protective mechanism 946) allows the ultra-violet radiation emitted by an ultra-violet radiation source to enter plasma etch chamber 902. In an embodiment, ultra-violet radiation sources 928 are attached to the outside of top cover 920 of plasma etch chamber 902. In such a deployment, openings in top cover 920 (which is protected by protective mechanism 946) allows the ultra-violet radiation emitted by an ultra-violet radiation source to enter plasma etch chamber 902.

Figure 10B:
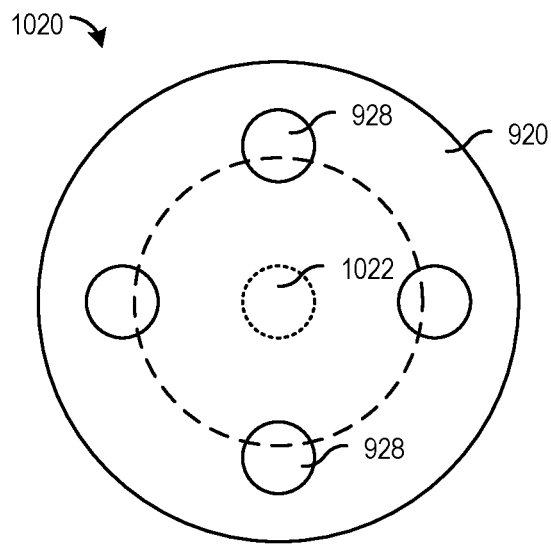
FIG. 10B illustrates a view of top cover of plasma etch chamber highlighting a first example arrangement of ultra-violet radiation sources in accordance with example embodiments presented herein.

FIG. 10B illustrates a view 1020 of top cover 920 of plasma etch chamber 902 highlighting a first example arrangement of ultra-violet radiation sources 928 in accordance with example embodiments presented herein. Ultra-violet radiation sources 928 are arranged in an annular arrangement on top cover 920 of plasma etch chamber 902. An alternative to first example arrangement of ultra-violet radiation sources 928 includes an ultra-violet radiation source 1022 disposed in about top cover 920 of plasma etch chamber 902. Although shown in FIG. 10B as having four (or five) ultra-violet radiation sources, the number of ultra-violet radiation sources may differ. Furthermore, not all of the ultra-violet radiation sources need to be emitting ultra-violet radiation at any given time.

Figure 10C:
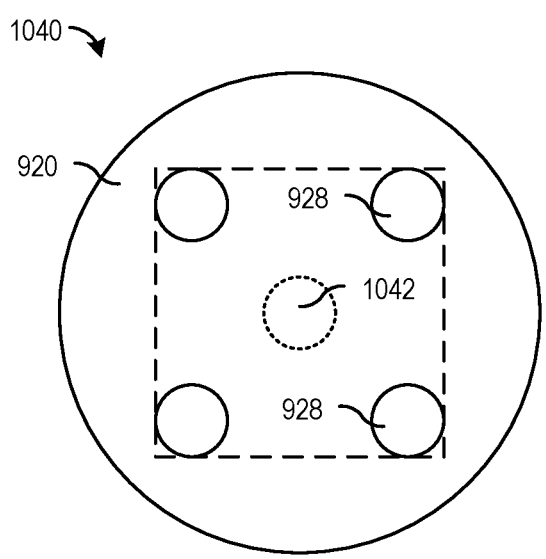
FIG. 10C illustrates a view of top cover of plasma etch chamber highlighting a second example arrangement of ultra-violet radiation sources in accordance with example embodiments presented herein.

FIG. 10C illustrates a view 1040 of top cover 920 of plasma etch chamber 902 highlighting a second example arrangement of ultra-violet radiation sources 928 in accordance with example embodiments presented herein. Ultra-violet radiation sources 928 are arranged in a rectangular arrangement on top cover 920 of plasma etch chamber 902. An alternative to second example arrangement of ultra-violet radiation sources includes an ultra-violet radiation source 1042 disposed in about top cover 920 of plasma etch chamber 902. Although shown in FIG. 10C as having four (or five) ultra-violet radiation sources, the number of ultra-violet radiation sources may differ. Furthermore, not all of the ultra-violet radiation sources need to be emitting ultra-violet radiation at any given time.

FIGS. 11A-11G illustrate example embodiments of a substrate processing flow with the substrate being exposed to ultra-violet radiation to help control by-product residue deposits in accordance with the example embodiments presented herein. The substrate processing flow is performed at least in part in a plasma etch chamber with ultra-violet radiation sources. The substrate processing flow may be a BEOL dual Damascene process flow, for example. However, the substrate processing flow may be applicable to other substrate process flows, including subtractive etch process flows.

Figure 11A:
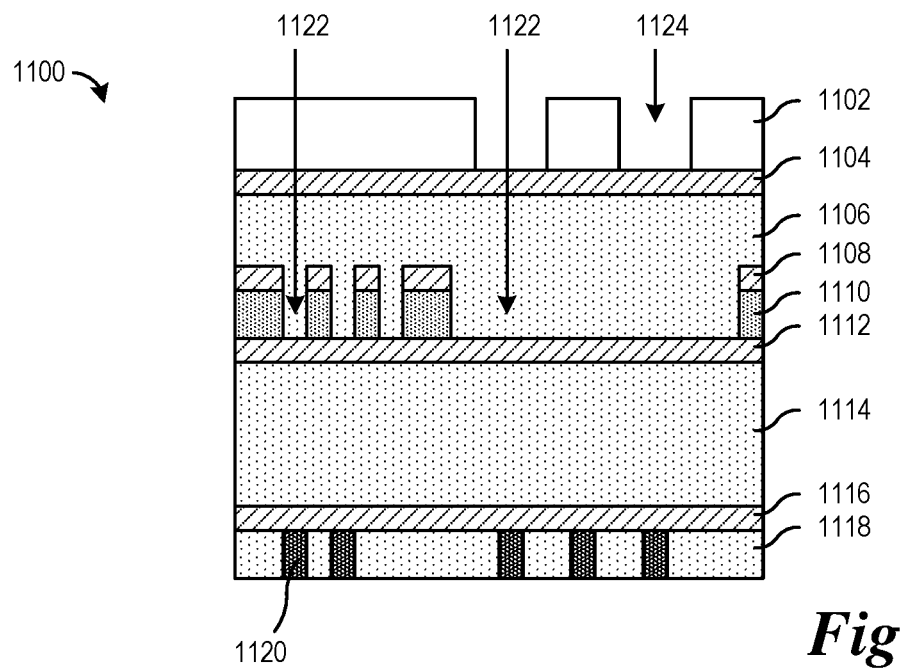
FIGS. 11A-11G illustrate example embodiments of a substrate processing flow with the substrate being exposed to ultra-violet radiation to help control by-product residue deposits in accordance with the example embodiments presented herein.

Referring now to FIG. 11A, where a wafer 1100 includes a substrate 1118 that includes contacts, such as contact 1120. A protective layer 1116, such as an ESL, is formed over substrate 1118 and the contacts. A dielectric layer 1114 is formed over protective layer 1116. Dielectric layer 1114 may be formed from a material having low-k or ULK properties. A first HM/MHM layer 1112 is formed over dielectric layer 1114.

A contact layer 1110 is formed over first HM/MHM layer 1112. A second HM/MHM layer 1108 is formed over contact layer 1110. Contact layer 1110 and second HM/MHM layer 1108 are patterned for openings, such as openings 1122. The openings may be used to form vias, contacts, and other features. An organic layer 1106 is formed over second HM/MHM layer 1108, filling contact layer 1110 and second HM/MHM layer 1108. A ARC layer 1104 is formed over organic layer 1106. A PR layer 1102 is formed over ARC layer 1104. PR layer 1102 is patterned for openings, such as opening 1124.

Figure 11B:
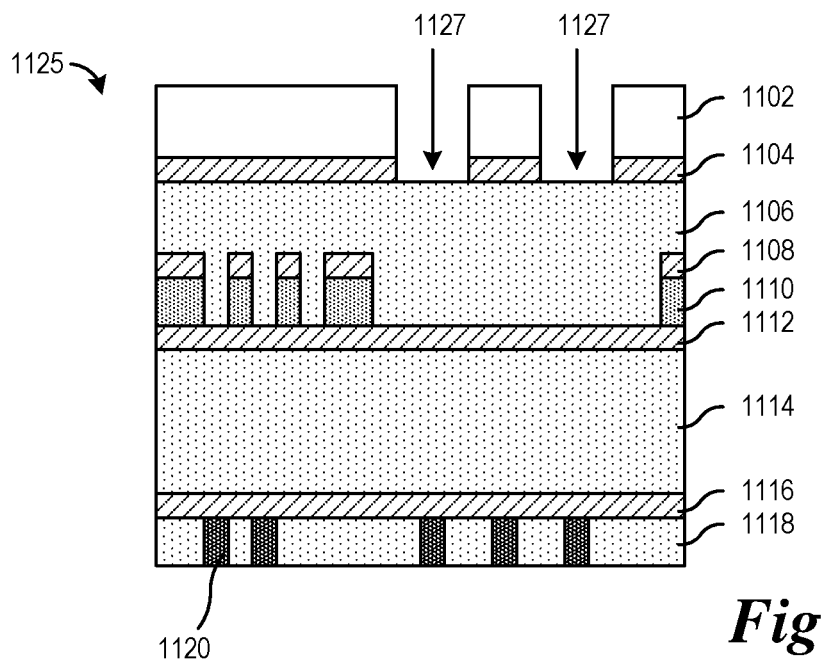

Referring now to FIG. 11B, where wafer 1125 illustrates wafer 1100 after an etch operation to form openings in ARC layer 1104. Openings in PR layer 1102, such as opening 1124, expose portions of ARC layer 1104 to the etch operation. Openings in ARC layer 1104 include openings 1127. During or after the etch operation, wafer 1110 may be irradiated with ultra-violet radiation. The ultra-violet radiation weakens chemical bonds of by-product residue that form when high polymerizing chemistries are used, allowing the removal of the by-product residue. An advantage of irradiating wafer 1110 with ultra-violet radiation during the etch operation is that the by-product residue may be removed as the etch operation progresses, preventing the formation of significant by-product residue deposits that may impede the etch process. In an embodiment, if high polymerizing chemistries are not used, the ultra-violet radiation exposure is optional.

Figure 11C:
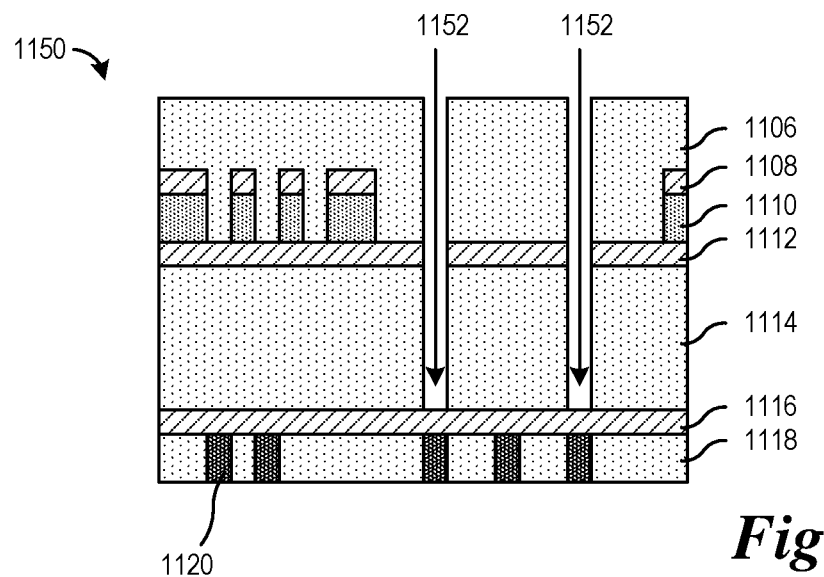

Referring now to FIG. 11C, where wafer 1150 illustrates wafer 1125 after an etch operation to open organic layer 1106. The etch operation forms openings 1152 through organic layer 1106, first HM/MHM layer 1112, and dielectric layer 1114. During or after the etch operation, wafer 1125 may be irradiated with ultra-violet radiation. The ultra-violet radiation weakens chemical bonds of by-product residue that form when high polymerizing chemistries are used, allowing the removal of the by-product residue. In an embodiment, if high polymerizing chemistries are not used, the ultra-violet radiation exposure is optional.

Figure 11D:
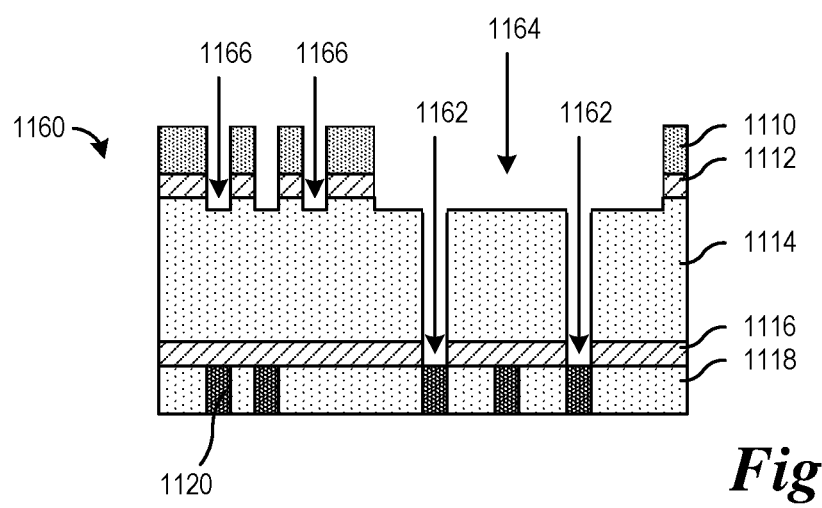

Referring now to FIG. 11D, where wafer 1160 illustrates wafer 1150 after an organic ash and dielectric HM open operation. The organic ash and dielectric HM open operation stripped organic layer 1106 and second HM/MHM layer 1108, as well as deepened openings 1152 into protective layer 1116 (where they are shown in FIG. 11D as openings 1162), and formed openings in first HM/MHM layer 1112 not covered by contact layer 1110 (where they are shown in FIG. 11D as openings 1164 and 1166). During or after the organic ash and dielectric HM open, wafer 1150 may be irradiated with ultra-violet radiation. The ultra-violet radiation weakens chemical bonds of by-product residue that form when high polymerizing chemistries are used, allowing the removal of the by-product residue. In an embodiment, if high polymerizing chemistries are not used, the ultra-violet radiation exposure is optional.

Figure 11E:
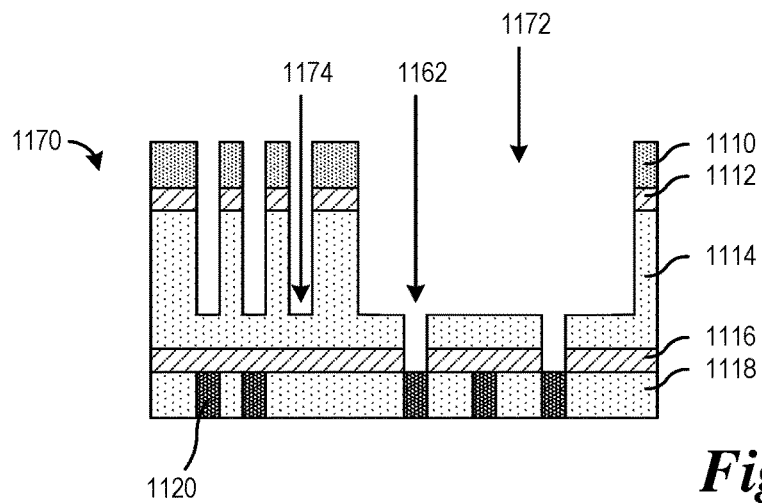

Referring now to FIG. 11E, where wafer 1170 illustrates wafer 1160 after a trench etch process. The trench etch process deepens openings in dielectric layer 1114 under openings (e.g., openings 1172 and 1174) in contact layer 1110. During or after the trench etch, wafer 1160 may be irradiated with ultra-violet radiation. The ultra-violet radiation weakens chemical bonds of by-product residue that form when high polymerizing chemistries are used, allowing the removal of the by-product residue. In an embodiment, if high polymerizing chemistries are not used, the ultra-violet radiation exposure is optional.

Figure 11F:
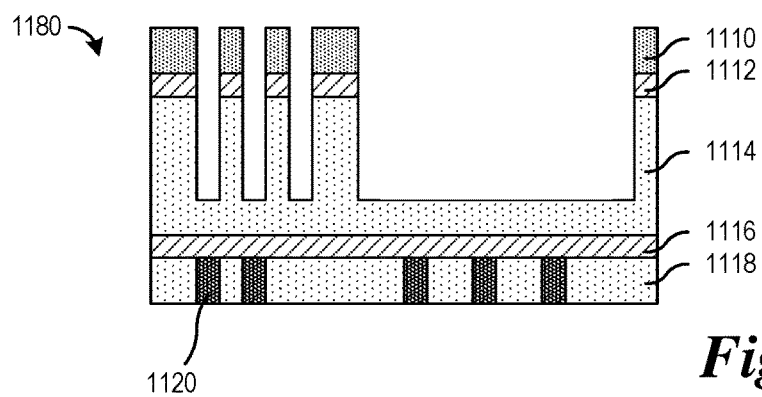

Referring now to FIG. 11F, where wafer 1180 illustrates wafer 1170 after a PET. The PET, such as a dry de-fluorine and/or a wet clean, can help to remove the by-product residue deposits, for example. During the PET or after the PET, depending on if the PET can be performed in the plasma etch chamber with ultra-violet radiation sources, wafer 1180 may be irradiated with ultra-violet radiation.

Figure 11G:
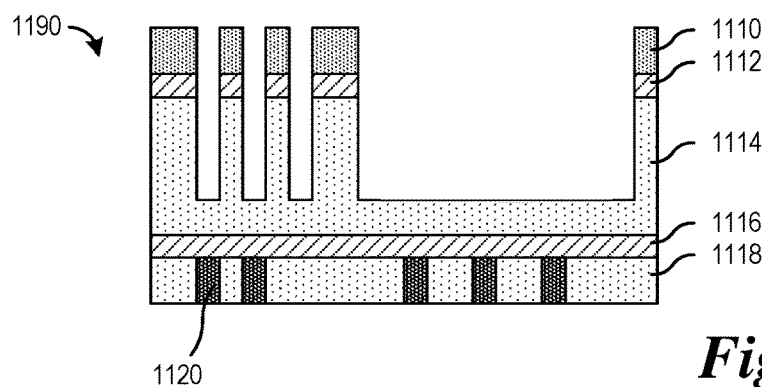

Referring now to FIG. 11G, where wafer 1190 illustrates wafer 1180 after a wet clean operation. The wet cleaning may be performed in a wet chamber using solvents and/or detergents. Different cleaning solvents and/or detergents may be used, depending upon the material being removed.

FIG. 12 illustrates a flow diagram of an example substrate process 1200 with ultra-violet radiation to assist in by-product residue removal in accordance with example embodiments presented herein. Substrate process 1200 may be indicative of operations occurring in the processing of a substrate at least in part in a plasma etch chamber with ultra-violet radiation sources. Substrate process 1200 may be a BEOL process or a FEOL process.

Substrate process 1200 begins with etching the substrate (block 1205). The substrate may be etched using a RIE with highly polymerizing chemistries, for example. The substrate is irradiated with ultra-violet radiation (block 1207). The ultra-violet radiation may have a particular wavelength or a range of wavelengths. The irradiation may be for a specified dose or duration. In an embodiment, the irradiation with the ultra-violet radiation occurs during the etching of the substrate in block 1205. In an embodiment, the irradiation of the ultra-violet radiation occurs after the etching of the substrate in block 1205.

After the ultra-violet radiation irradiation, the substrate is etched (block 1209). In an embodiment, the substrate etch is a continuation of the etching of block 1205. The continued etch deepens openings formed by the etching of block 1205, for example. In an embodiment, the substrate etch is a new etch of the substrate. The new etch may be different etch technology or a different etch chemistry, for example.

Optionally, after the substrate etch of block 1209, the substrate may be irradiated with ultra-violet radiation (block 1211). In an embodiment, the ultra-violet radiation of block 1211 is the same (i.e., same wavelength or range of wavelengths, and same dose or duration) as the ultra-violet radiation of block 1207. In an embodiment, the ultra-violet radiation of block 1211 is different (i.e., different wavelength or range of wavelengths, different dose or duration, or different wavelength and different dose or duration) as the ultra-violet radiation of block 1207.

In an embodiment, the substrate etch of block 1205 and the ultra-violet radiation irradiation of block 1207 defines a process cycle. Similarly, the substrate etch of block 1209 and the ultra-violet radiation irradiation of block 1211 defines another process cycle. Substrate process 1200 may then be described as being cyclic in nature, with one or more process cycles. The processes described above may be performed cyclically as illustrated by dashed loop 1213. In any particular cycle, the ultra-violet radiation irradiation is optional. As an example, if an etch is performed not utilizing high polymerizing chemistries, ultra-violet radiation irradiation may not be needed because by-product residue production may be low to non-existent. As an example, a controller (such as controller 748 shown in FIGS. 7A and 8A), measures the presence and/or amount of by-product residue, and adjusts one or more parameters of the ultra-violet radiation, such as the ultra-violet radiation wavelength range, dose, duration, or a combination thereof, to help remove the by-product residue.

Substrate process 1200 continues with additional processing (block 1215). Additional processing of the substrate may include etching, cleaning, wet cleaning, PET, etc.

As discussed above, a substrate is held in place in a plasma etch chamber by an electrostatic chuck. Electrostatic force holds the substrate to the electrostatic chuck. After processing in the plasma etch chamber completes, the substrate is removed from the plasma etch chamber for further processing at other process stations. However, a residual electrostatic force may hold the substrate in the electrostatic chuck longer than intended, thereby extending the overall substrate process time and decreasing substrate process efficiency. Residual electrostatic force may be present in the electrostatic chuck. Additional residual electrostatic force may be present in the gas and the plasma etch chamber.

If removal of the substrate is attempted before the electrostatic force drops below a threshold level, the amount of force required to remove the substrate from the electrostatic chuck may be high. Because the substrate is fragile, the excessive force used to remove the substrate may damage the substrate.

According to an example embodiment, a substrate is irradiated with ultra-violet radiation to assist wafer discharge. The ultra-violet radiation with specific dose or duration helps to dissipate residual electrostatic charge/force holding the substrate to the electrostatic chuck. In an embodiment, the ultra-violet radiation is at the same wavelength (or range of wavelengths) as used during the irradiation of the substrate to help remove by-product residues. In an embodiment, when the plasma etch chamber features a plurality of ultra-violet radiation sources, all of the plurality of ultra-violet radiation sources are turned on to help discharge residual electrostatic force.

FIG. 13 illustrates a flow diagram of an example substrate process 1300 with ultra-violet radiation to assist in substrate discharge in accordance with example embodiments presented herein. Substrate process 1300 may be indicative of operations occurring in the processing of a substrate at least in part in a plasma etch chamber with ultra-violet radiation sources. Substrate process 1300 may be a BEOL process or a FEOL process.

Substrate process 1300 begins with etching the substrate (block 1305). The substrate may be etched using any plasma etch process, for example. Etching of the substrate may include steps such as turning on process gases, turning on the upper and lower electrodes, and so on. After etching the substrate completes, a discharge procedure is performed (block 1307). The discharge procedure may include turning off the high frequency voltage to the upper and lower electrodes, turning off the electrostatic force to the electrostatic chuck (by turning off the DC power source, for example), turning off the process gas flow, venting process gas, opening the loading or unloading port, etc.

Irradiate the substrate with ultra-violet radiation from the ultra-violet radiation sources (block 1309). In an embodiment, the ultra-violet radiation sources are turned on to provide a specified dose (a specified dose in a range of 100 mJ and 2000 mJ) or a specified duration sufficient to discharge residual electrostatic force. The substrate is removed from the electrostatic chuck and moved out of the plasma etch chamber (block 1311). Substrate process 1300 continues with additional processing (block 1313). Additional processing of the substrate may include etching, cleaning, wet cleaning, PET, etc. In an embodiment, the ultra-violet radiation sources are turned off prior to removing the substrate from the electrostatic chuck and moving the substrate out of the plasma etch chamber. In an embodiment, the ultra-violet radiation sources are turned off after removing the substrate from the electrostatic chuck and moving the substrate out of the plasma etch chamber.

Example embodiments of the invention are summarized here. Other embodiments can also be understood from the entirety of the specification as well as the claims filed herein.

Example 1. A method for processing a substrate, the method including: performing a first etch process to form a plurality of partial features in a dielectric layer disposed over the substrate; performing an irradiation process to irradiate the substrate with ultra-violet radiation having a wavelength between 100 nm and 200 nm; and after the irradiation process, performing a second etch process to form a plurality of features from the plurality of partial features.

Example 2. The method of example 1, where the first etch process and the irradiation process are performed in the same process chamber.

Example 3. The method of one of examples 1 or 2, further including transporting the substrate from a first process chamber to a second process chamber, where the first etch process is formed in the first process chamber, and the irradiation process is performed in the second process chamber.

Example 4. The method of one of examples 1 to 3, where the first process chamber and the second process chamber are in different substrate processing apparatus.

Example 5. The method of one of examples 1 to 4, where the first etch process and the irradiation process are performed sequentially.

Example 6. The method of one of examples 1 to 5, where the first etch process is a different type of etch process from the second etch process.

Example 7. The method of one of examples 1 to 6, where the first etch process and the second etch process are a same type of etch process.

Example 8. The method of one of examples 1 to 7, where the first etch process includes a plasma etch process.

Example 9. A method for processing a substrate, the method including: executing a cyclic process including a plurality of sequences, each sequence of the plurality of sequences including exposing the substrate to ultra-violet radiation after exposing the substrate to a plasma process.

Example 10. The method of example 9, where a first plasma process performed in a first sequence is a different type of etch process from a second plasma process performed in a second sequence.

Example 11. The method of one of examples 9 or 10, where a first plasma process performed in a first sequence is a same type of etch process as a second plasma process performed in a second sequence.

Example 12. The method of one of examples 9 to 11, where each sequence of the plurality of sequences further includes transporting the substrate to a process chamber prior to exposing the substrate to the ultra-violet radiation, where exposing the substrate to the ultra-violet radiation occurs in the process chamber.

Example 13. The method of one of examples 9 to 12, where each sequence of the plurality of sequences further includes transporting the substrate to a process chamber prior to exposing the substrate to the plasma process, where exposing the substrate to the ultra-violet radiation and exposing the substrate to the plasma process occur in the process chamber.

Example 14. The method of one of examples 9 to 13, where each sequence of the plurality of sequences further includes: transporting the substrate to a first process chamber prior to exposing the substrate to the plasma process, where exposing the substrate to the plasma process occurs in the first process chamber; and transporting the substrate to a second process chamber prior to exposing the substrate to the ultra-violet radiation, where exposing the substrate to the ultra-violet radiation occurs in the second process chamber.

Example 15. A system including: a plurality of processing chambers configured to process a substrate within the processing chambers; a wafer holding location including a first ultra-violet radiation source configured to emit ultra-violet radiation onto a wafer located at the wafer holding location; and a transporting apparatus configured to move the substrate between the plurality of processing chambers and the wafer holding location.

Example 16. The system of example 15, where the wafer holding location further includes a second ultra-violet radiation source configured to emit ultra-violet radiation onto the substrate located at the wafer holding location, and where the first and second ultra-violet radiation sources are disposed on an interior surface of a device wall of the wafer holding location, the device wall being substantially perpendicular to a major surface of the substrate.

Example 17. The system of one of examples 15 or 16, where the first and second ultra-violet radiation sources are arranged in an annular configuration.

Example 18. The system of one of examples 15 to 17, where the wafer holding location further includes a second ultra-violet radiation source configured to emit ultra-violet radiation onto the substrate located at the wafer holding location, and where the first and second ultra-violet radiation sources are disposed on a device top of the wafer holding location, the device top being substantially parallel to a major surface of the substrate.

Example 19. The system of one of examples 15 to 18, where the first and second ultra-violet radiation sources are arranged in an annular configuration.

Example 20. The system of one of examples 15 to 19, where the first and second ultra-violet radiation sources are arranged in a rectangular configuration.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for processing a substrate, the method comprising:
   performing a first etch process to form a plurality of partial features in a dielectric layer disposed over the substrate;
   performing an irradiation process to irradiate the substrate with ultra-violet radiation having a wavelength between 100 nm and 200 nm; and
   after the irradiation process, performing a second etch process to form a plurality of features from the plurality of partial features.

2. The method of claim 1, wherein the method is configured to control by-product residue deposits formed in the first etch process and control damage to the dielectric layer during the second etch process.

3. The method of claim 1, further comprising transporting the substrate from a first process chamber to a second process chamber, wherein the first etch process is formed in the first process chamber, and the irradiation process is performed in the second process chamber.

4. The method of claim 1, wherein the first etch process and the irradiation process are performed in the same process chamber.

5. The method of claim 1, wherein the first etch process and the irradiation process are performed sequentially.

6. The method of claim 1, wherein the first etch process is a different type of etch process from the second etch process.

7. The method of claim 1 wherein performing the irradiation process to irradiate the substrate starts after a completion of the first etch process, before the second etch process starts, or after the second etch process has started.

8. The method of claim 1, wherein performing the irradiation process to irradiate the substrate comprises selecting a dose, a duration, or a wavelength used in the radiation process.

9. A method for processing a substrate, the method comprising:

executing a cyclic process comprising a plurality of sequences, each sequence of the plurality of sequences comprising exposing the substrate to electromagnetic radiation after exposing the substrate to a plasma process.

10. The method of claim 9, wherein the substrate comprises a dielectric layer, wherein the cyclic process forms a plurality of features in the dielectric layer, and wherein the method is configured to control by-product residue deposits formed when the substrate is exposed to the plasma process.

11. The method of claim 9, wherein exposing the substrate comprises selecting a dose, a duration, or a wavelength of the electromagnetic radiation used in the exposing.

12. The method of claim 9, wherein a first plasma process performed in a first sequence is a different type of etch process from a second plasma process performed in a second sequence.

13. The method of claim 9, wherein a first plasma process performed in a first sequence is a same type of etch process as a second plasma process performed in a second sequence.

14. The method of claim 9, wherein each sequence of the plurality of sequences further comprises transporting the substrate to a process chamber prior to exposing the substrate to the electromagnetic radiation, wherein exposing the substrate to the electromagnetic radiation occurs in the process chamber.

15. The method of claim 9, wherein each sequence of the plurality of sequences further comprises transporting the substrate to a process chamber prior to exposing the substrate to the plasma process, wherein exposing the substrate to the electromagnetic radiation and exposing the substrate to the plasma process occur in the process chamber.

16. The method of claim 9, wherein each sequence of the plurality of sequences further comprises:

transporting the substrate to a first process chamber prior to exposing the substrate to the plasma process, wherein exposing the substrate to the plasma process occurs in the first process chamber; and transporting the substrate to a second process chamber prior to exposing the substrate to the electromagnetic radiation, wherein exposing the substrate to the electromagnetic radiation occurs in the second process chamber.

* * * * *